United States Patent
Han et al.

(10) Patent No.: US 12,394,484 B2
(45) Date of Patent: Aug. 19, 2025

(54) MEMORY DEVICE INCLUDING SELECT LINES

(71) Applicant: SK hynix Inc., Icheon-si (KR)

(72) Inventors: Yun Cheol Han, Icheon-si (KR); Nam Kuk Kim, Icheon-si (KR); Dae Ro Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 426 days.

(21) Appl. No.: 17/944,704

(22) Filed: Sep. 14, 2022

(65) Prior Publication Data
US 2023/0297240 A1 Sep. 21, 2023

(30) Foreign Application Priority Data
Mar. 17, 2022 (KR) .................. 10-2022-0033637

(51) Int. Cl.
*G11C 16/10* (2006.01)
*G11C 11/00* (2006.01)
*G11C 16/04* (2006.01)
*G11C 16/08* (2006.01)

(52) U.S. Cl.
CPC .......... *G11C 16/0483* (2013.01); *G11C 16/08* (2013.01)

(58) Field of Classification Search
CPC .... G11C 16/0483; G11C 16/08; H10B 43/50; H10B 43/27; H10B 43/40; H10B 43/30
See application file for complete search history.

(56) References Cited

U.S. PATENT DOCUMENTS

| | | | | |
|---|---|---|---|---|
| 2020/0381058 A1* | 12/2020 | Lee | ...................... | G11C 11/5671 |
| 2023/0154505 A1* | 5/2023 | Chun | ...................... | G11C 7/20 |
| | | | | 365/185.25 |
| 2024/0079069 A1* | 3/2024 | Yang | ...................... | G11C 16/08 |
| 2024/0212761 A1* | 6/2024 | Seo | ...................... | G11C 16/24 |
| 2024/0379162 A1* | 11/2024 | Chae | ...................... | G11C 5/063 |

FOREIGN PATENT DOCUMENTS

| | | |
|---|---|---|
| KR | 1020170119158 A | 10/2017 |
| KR | 1020170124378 A | 11/2017 |
| KR | 1020190051694 A | 5/2019 |
| KR | 1020200020187 A | 2/2020 |

* cited by examiner

*Primary Examiner* — Hien N Nguyen
(74) *Attorney, Agent, or Firm* — WILLIAM PARK & ASSOCIATES LTD.

(57) ABSTRACT

The present disclosure relates to a memory device including a first memory block including a first group of cell plugs and a second group of cell plugs, a second memory block including a third group of cell plugs and a fourth group of cell plugs, a connection region located between the first and second memory blocks, a first source select line commonly coupled to the first group of cell plugs and third group of cell plugs, a second source select line coupled to the second group of cell plugs, and a third source select line coupled to the fourth group of cell plugs.

20 Claims, 19 Drawing Sheets

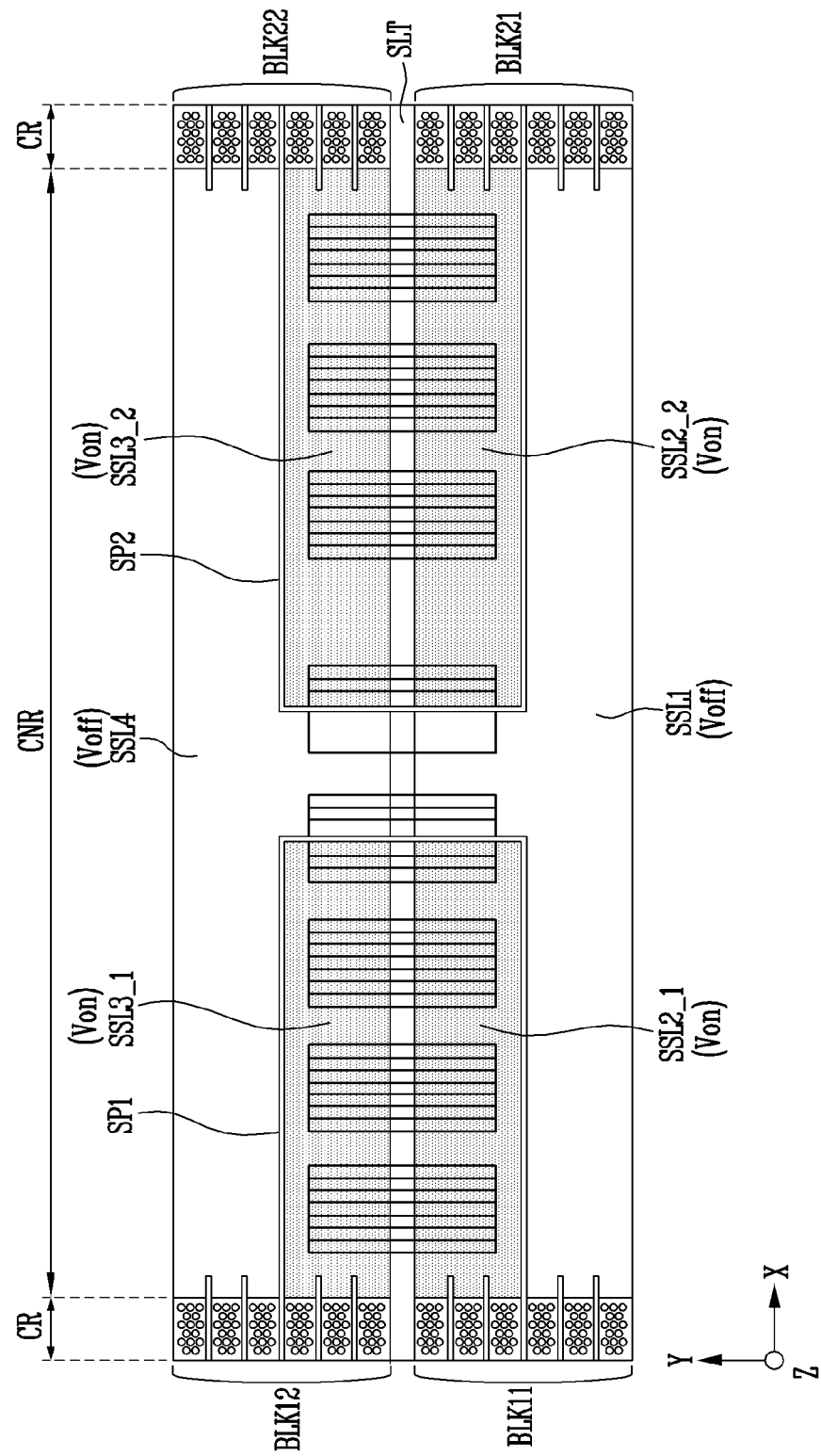

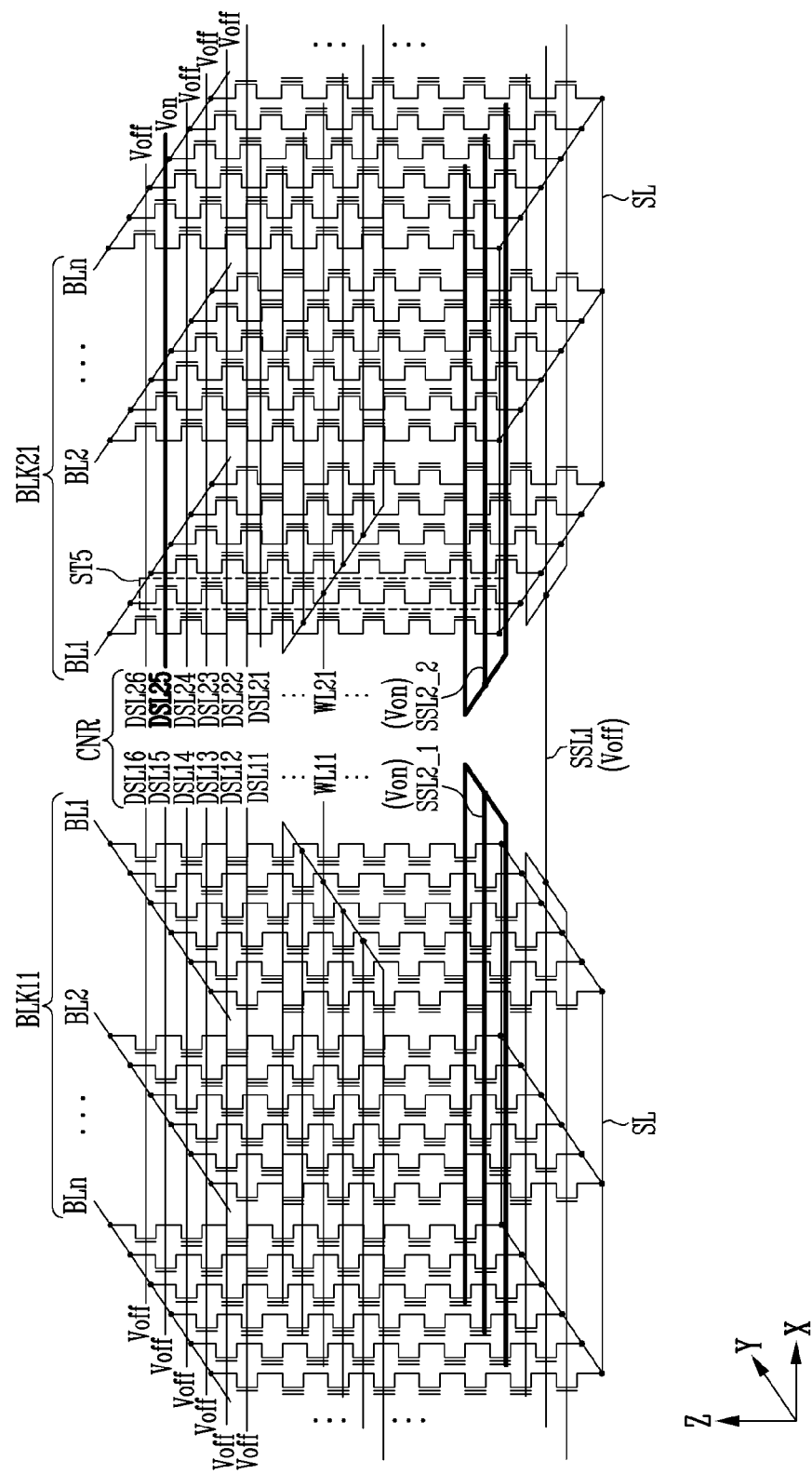

MEMORY DEVICE INCLUDING SELECT LINES

CROSS-REFERENCE TO RELATED APPLICATION

The present application claims priority under 35 U.S.C. § 119(a) to Korean patent application number 10-2022-0033637 filed on Mar. 17, 2022, in the Korean Intellectual Property Office, the entire disclosure of which is incorporated by reference herein.

BACKGROUND

1. Technical Field

Various embodiments relate generally to a memory device including select lines, and more particularly, to a memory device including a plurality of memory blocks commonly coupled to select lines.

2. Related Art

Three-dimensional memory devices that include a plurality of memory cells arranged in three dimensions have been proposed to improve a degree of integration of memory devices.

To improve the integration density of three-dimensional memory devices, the number of memory cells stacked on top of each other in the memory devices may be increased, and the distance between the memory cells may be reduced. When the degree of integration is increased, the size of the memory device may be reduced, and interference between the memory cells may be increased.

SUMMARY

According to an embodiment, a memory device may include a first memory block including a first group of cell plugs and a second group of cell plugs, a second memory block including a third group of cell plugs and a fourth group of cell plugs, a connection region located between the first and second memory blocks, a first source select line commonly coupled to the first group of cell plugs and third group of cell plugs, a second source select line coupled to the second group of cell plugs, and a third source select line coupled to the fourth group of cell plugs.

According to an embodiment, a memory device may include a peripheral circuit, and a memory cell array including a source line, source select lines, word lines, and drain select lines stacked on the peripheral circuit, wherein the memory cell array comprises first and second memory blocks arranged in a first direction, and a connection region located between the first and second memory blocks, wherein the source select lines comprise: a first source select line commonly coupled to a first group of cell plugs included in the first memory block and a second group of cell plugs included in the second memory block, a second source select line coupled to a third group of cell plugs included in the first memory block and extending to the connection region, and a third source select line coupled to a fourth group of cell plugs included in the second memory block and extending to the connection region.

BRIEF DESCRIPTION OF THE DRAWINGS

FIGS. 7A and 7B are diagrams illustrating a voltage applied to source select lines according to an embodiment of the present disclosure;

FIGS. 11A and 11B are diagrams illustrating a method of operating a memory device according to an embodiment of the present disclosure;

DETAILED DESCRIPTION

Figure 1:
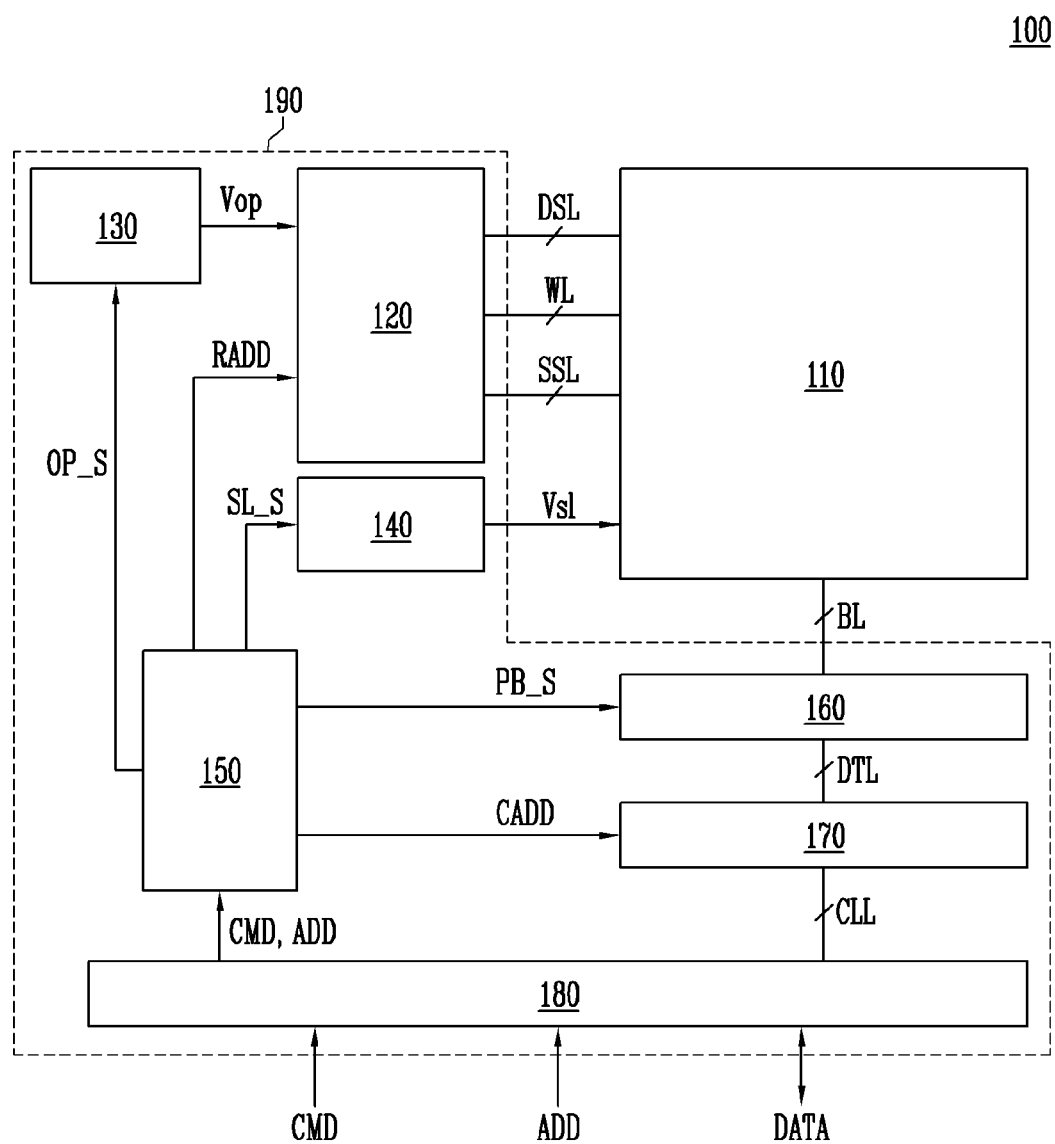
FIG. 1 is a diagram illustrating a memory device according to an embodiment of the present disclosure.

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification. It will be understood that, although the terms first, second, third etc., may be used herein to describe various lines, patterns, plugs, contacts, strings, wires, blocks, structures, groups, holes, slits, channels, elements, components, regions, layers and/or sections etc., these lines, patterns, plugs, contacts, strings, wires, blocks, structures, groups, holes, slits, channels, elements, components, regions, layers and/or sections etc., should not be limited by these terms. These terms are only used to distinguish one lines, patterns, plugs, contacts, strings, wires, blocks, structures, groups, holes, slits, channels, elements, components, regions, layers and/or sections etc., from another lines, patterns, plugs, contacts, strings, wires, blocks, structures, groups, holes, slits, channels, elements, components, regions, layers and/or sections etc. Thus, a first lines, patterns, plugs, contacts, strings, wires, blocks, structures, groups, holes, slits, channels, elements, components, regions, layers and/or sections etc., discussed below could be termed a second lines, patterns, plugs, contacts, strings, wires, blocks, structures, groups, holes, slits, channels, elements, components, regions, layers and/or sections etc., without departing from the teachings of the present disclosure. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

Hereinafter, embodiments of the present disclosure will be described in detail with reference to the accompanying drawings in order for those skilled in the art to be able to readily implement the technical spirit of the present disclosure.

Various embodiments are directed to a memory device capable of improving an integration density.

Various embodiments are directed to a memory device capable of reducing interference between memory cells.

FIG. 1 is a diagram illustrating a memory device 100 according to an embodiment of the present disclosure.

Referring to FIG. 1, the memory device 100 may include a peripheral circuit 190 and a memory cell array 110.

The memory cell array 110 may include a plurality of memory cells that store data. According to an embodiment, the memory cell array 110 may include a three-dimensional memory cell array. The plurality of memory cells may store single bit data or multi-bit data of two or more bits according to a program method. The plurality of memory cells may form a plurality of strings. The memory cell array 110 may have a two-dimensional or three-dimensional structure. In the two-dimensionally structured memory cell array 110, strings may extend in a horizontal direction with respect to a substrate. In the three-dimensionally structured memory cell array 110, strings may extend from a substrate in a vertical direction. Hereinafter, an embodiment of the memory device 100 which includes the memory cell array 110 will be described.

The peripheral circuit 190 may perform a program operation and a verify operation for storing data in the memory cell array 110, a read operation for outputting the data stored in the memory cell array 110, and an erase operation for erasing the data stored in the memory cell array 110. For example, the peripheral circuit 190 may include a voltage generating circuit 130, a row decoder 120, a source line driver 140, a control circuit 150, a page buffer 160, a column decoder 170, and an input/output circuit 180.

The voltage generating circuit 130 may generate various operating voltages Vop for a program operation, a read operation, or an erase operation in response to an operating signal OP_S. For example, the voltage generating circuit 130 may selectively generate and output various operating voltages Vop which include a program voltage, a verify voltage, a pass voltage, a read voltage, an erase voltage, a turn-on voltage, or a turn-off voltage. The program voltage may be applied to a selected word line which is coupled to a selected memory cell to increase a threshold voltage of the selected memory cell. The verify voltage and the read voltage may be applied to the selected memory cell to sense and determine the threshold voltage of the selected memory cell. The erase voltage may be applied to the selected word line, the source line, or the substrate to erase data from selected memory cells. The turn-on voltage may be applied to turn on select transistors. The turn-off voltage may be applied to turn off the select transistors.

The row decoder 120 may be coupled to the memory cell array 110 through a plurality of drain select lines DSL, a plurality of word lines WL, and a plurality of source select lines SSL. The row decoder 120 may transfer the operating voltages Vop to the plurality of drain select lines DSL, the plurality of word lines WL, and the plurality of source select lines SSL in response to a row address RADD. For example, when there are a plurality of drain select lines DSL or a plurality of source select lines SSL, the row decoder 120 may transfer the operating voltages Vop to a selected drain select line among the plurality of drain select lines DSL or to a selected source select line among the plurality of source select lines SSL.

The source line driver 140 may transfer a source voltage Vsl to the memory cell array 110 in response to a source line signal SL_S. For example, the source voltage Vsl may be transferred to a source line which is coupled to the memory cell array.

The control circuit 150 may output the operating signal OP_S, the row address RADD, a source line control signal SL_S, a page buffer control signal PB_S, and a column address CADD in response to a command CMD and an address ADD.

The page buffer 160 may be coupled to the memory cell array 110 through bit lines BL. The page buffer 160 may temporarily store data DATA received through the plurality of bit lines BL in response to the page buffer control signal PB_S. The page buffer 160 may sense voltages or currents in the plurality of bit lines BL during a read operation.

The column decoder 170 may transfer the data DATA, which is input from the input/output circuit 180, to the page buffer 160, or may transfer the data DATA stored in the page buffer 160 to the input/output circuit 180 in response to the column address CADD. The column decoder 170 may exchange the data DATA with the input/output circuit 180 through column lines CLL and the data DATA with the page buffer 160 through data lines DTL.

The input/output circuit 180 may transfer the command CMD and the address ADD, which are transferred from an external device (e.g., a controller) coupled to the memory device 100 to the control circuit 150, and may output data received from the column decoder 170 to the external device.

Figure 2:
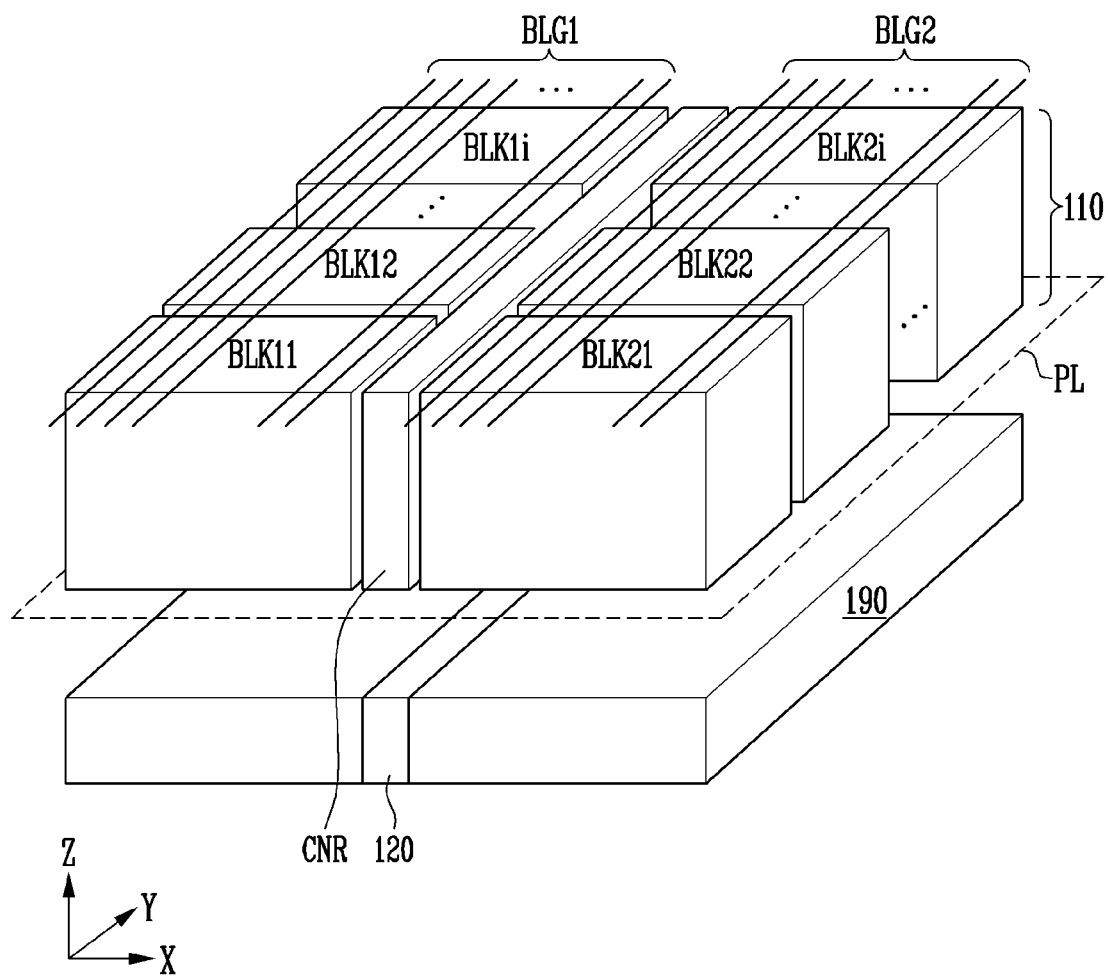
FIG. 2 is a diagram illustrating the structure of a memory device according to an embodiment of the present disclosure.

FIG. 2 is a diagram illustrating the structure of a memory device according to an embodiment of the present disclosure.

Referring to FIG. 2, the memory cell array 110 which is included in the memory device may be disposed over the peripheral circuit 190. For example, the peripheral circuit 190 may be disposed over the substrate, and the memory cell array 110 may be disposed over the peripheral circuit 190.

The memory cell array 110 may include a plane PL which includes 11th to 21th memory blocks BLK11 to BLK21, where i is a positive integer. For example, the plane PL may refer to an area where memory blocks sharing a source line are arranged. The 11th to 21th memory blocks BLK11 to BLK21 may be arranged in an X direction and a Y direction. For example, the 11th to 1ith memory blocks BLK11 to BLK1i may be arranged in the Y direction, and 21st to 21th memory blocks BLK21 to BLK21 may be arranged in the Y direction. A first bit line group BLG1 may be coupled to the 11th to 1ith memory blocks BLK11 to BLK1i may be coupled to the first bit line group BLG1. A second bit line group BLG2 may be coupled to the 21st to 21th memory blocks BLK21 to BLK2i. The first and second bit line groups BLG1 and BLG2 may include a plurality of bit lines. The 11th to 1ith memory blocks BLK11 to BLK1i may be separated from the 21st to 21th memory blocks BLK21 to BLK2i in the X direction.

A connection region CNR for connecting the memory blocks to the peripheral circuit 190 may be formed between the 11th to 1ith memory blocks BLK11 to BLK1i and the 21st to 21th memory blocks BLK21 to BLK2i. The row decoder 120 which is included in the peripheral circuit 190 may be disposed under the connection region CNR. For example, the row decoder 120 may be coupled to gate lines of a selected memory block or selected memory blocks among the 11th to 21th memory blocks BLK11 to BLK2i through contacts which are formed in the connection region CNR.

According to an embodiment, during a program, read, or erase operation, memory blocks which are adjacent to each other in the X direction may be simultaneously selected. For example, the 11th and 21st memory blocks BLK11 and BLK21 may be selected at the same time, whereas the remaining 12th to 1ith memory blocks BLK12 to BLK1i and the 22nd to 21th memory blocks BLK22 to BLK2i might not be selected.

Figure 3:
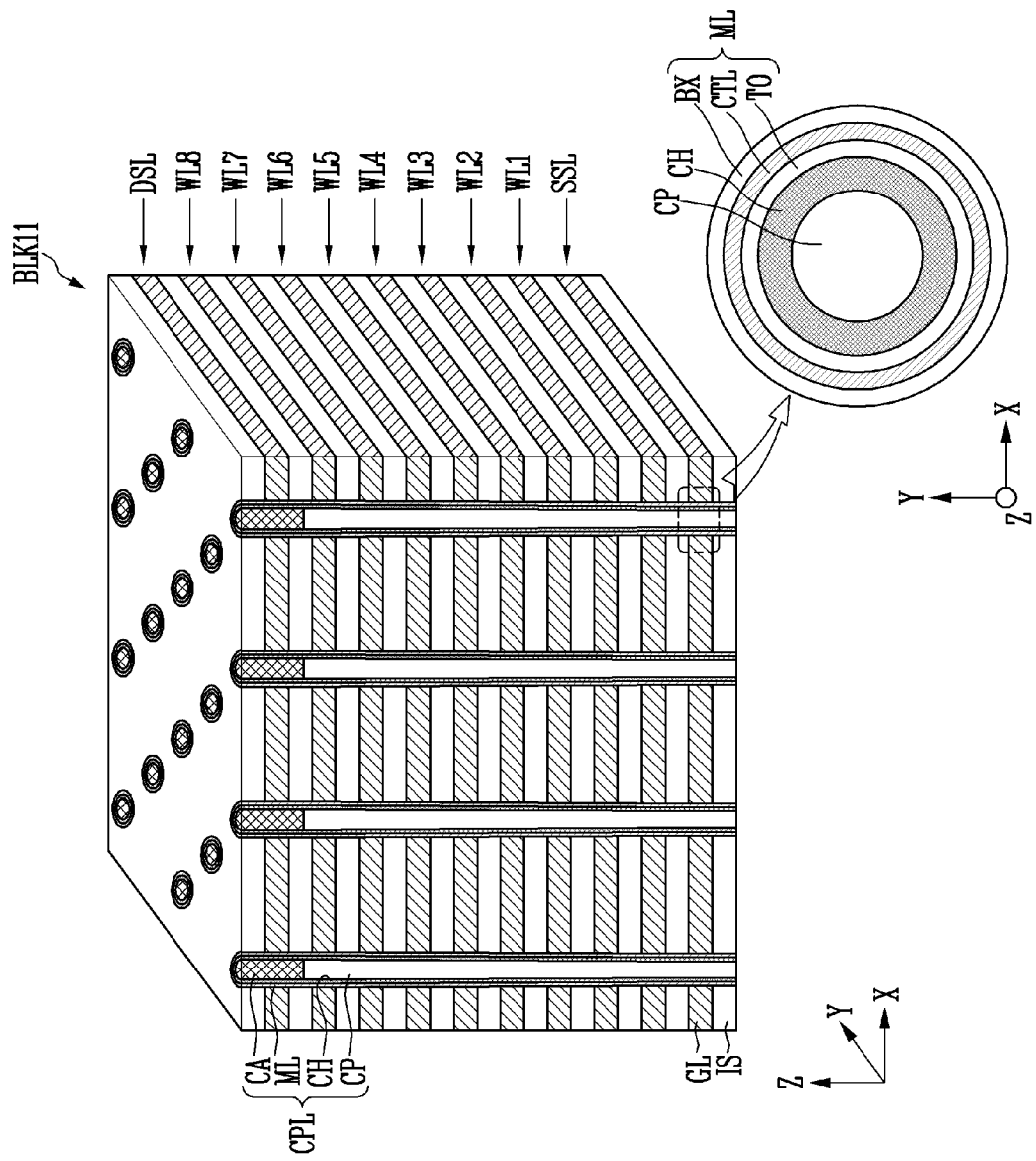
FIG. 3 is a diagram illustrating the structure of a memory block.

FIG. 3 is a diagram illustrating the structure of the memory block BLK11.

To describe the structure of a memory block, FIG. 3 illustrates the 11th memory block BLK11, among the 11th to 21th memory blocks BLK11 to BLK2i as shown in FIG. 2, as an example.

The 11th memory block BLK11 may include insulating layers IS, gate lines GL, and cell plugs CPL. The insulating layers IS and the gate lines GL may be stacked alternately with each other on a lower structure. The cell plugs CPL may vertically pass through the insulating layers IS and the gate lines GL. For example, the lower structure may be a source line. The source line may be formed above the peripheral circuit and the peripheral circuit may be formed on the substrate. The gate lines GL may include the source select line SSL, word lines WL1 to WL8, and the drain select line DSL. FIG. 3 is a perspective view for an explanation of the structure of the 11th memory block BLK11. The numbers of source select lines SSL, word lines WL1 to WL8, and drain select lines DSL are not limited to those of FIG. 3.

Each of the insulating layers IS may include an oxide layer or a silicon oxide layer, and each of the gate lines GL may include a conductive layer. For example, the gate lines GL may include at least one of tungsten (W), cobalt (Co), nickel (Ni), molybdenum (Mo), silicon (Si), and polysilicon (poly-Si).

Each of the cell plugs CPL may include a memory layer ML, a channel layer CH, and a core plug CP. For example, the core plug CP which extends in the Z direction may be formed at the center of the cell plug CPL. The channel layer CH may surround a side surface of the core plug CP and the memory layer ML may surround a side surface of the channel layer CH. The core plug CP may include an insulating layer or a conductive layer. The channel layer CH may include a doped silicon layer. The memory layer ML may include a tunnel isolation layer TO, a charge trap layer CTL, and a blocking layer BX. The tunnel isolation layer TO may surround the side surface of the channel layer CH and include an oxide layer or a silicon oxide layer. The charge trap layer CTL may surround the surface of the tunnel isolation layer TO and include a material capable of trapping charges. For example, the charge trap layer CTL may include a nitride layer. The blocking layer BX may surround a side surface of the charge trap layer CTL and include an oxide layer or a silicon oxide layer.

The cell plugs CPL may further include a capping layer CA which is formed over the core plug CP. The capping layer CA may include a doped silicon layer. The capping layer CA may be formed in a region where the drain select line DSL is formed.

Figure 4:
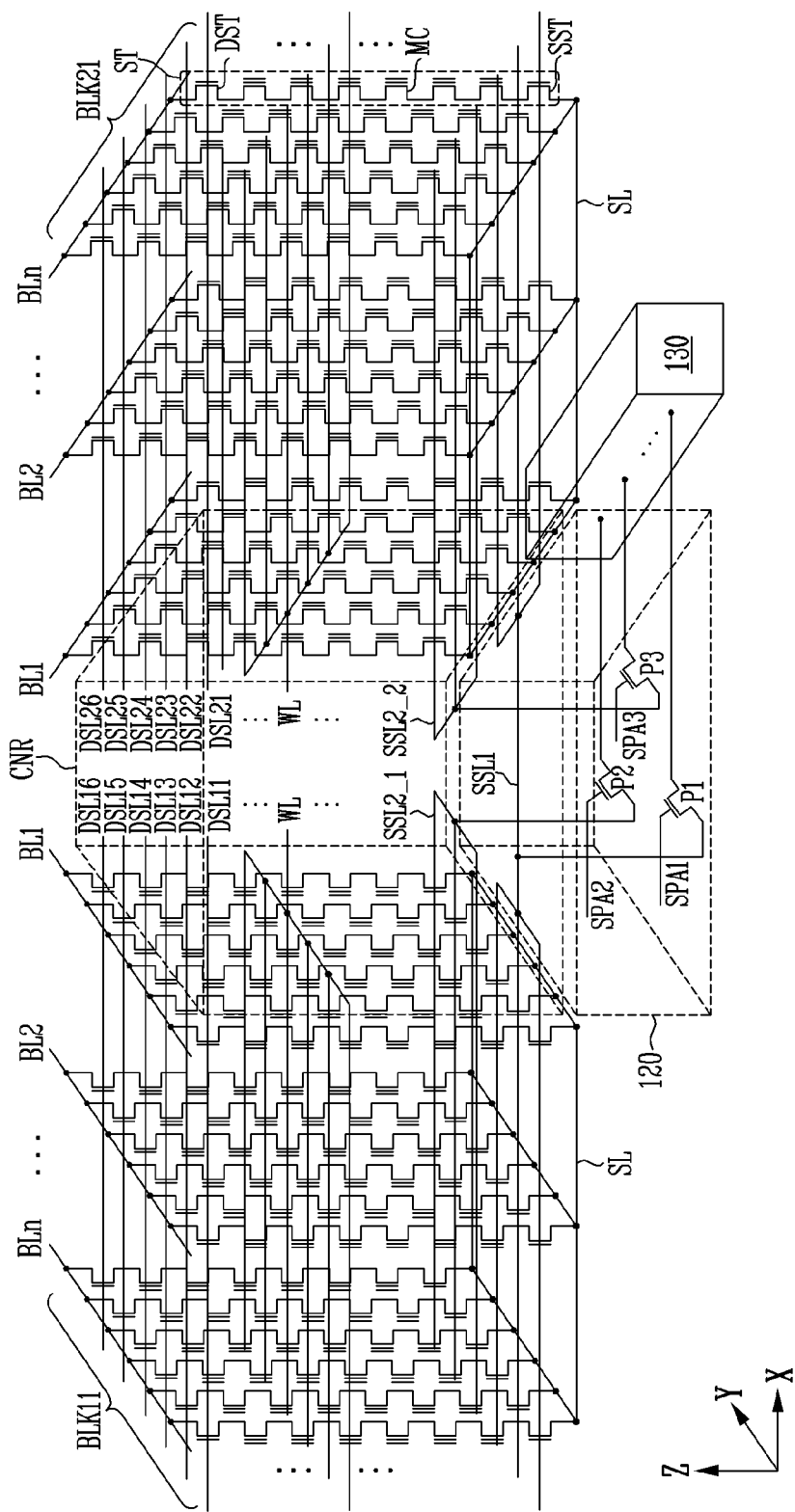
FIG. 4 is a circuit diagram illustrating the connection between memory blocks according to an embodiment of the present disclosure.

FIG. 4 is a circuit diagram illustrating the connection between memory blocks according to an embodiment of the present disclosure.

Referring to FIG. 4, each of the 11th and 21st memory blocks BLK11 and BLK21 which are simultaneously selected by the row decoder 120 may include strings ST which extend in the Z direction and are arranged in the X and Y directions. The strings ST may be coupled between bit lines BL1 to BLn and a source line SL. Each of the strings ST may include source select transistors SST, memory cells MC, and drain select transistors DST. For example, the source select transistors SST may be coupled between a source line and the memory cells MC, and the drain select transistors DST may be coupled between the memory cells MC and the bit lines BL1 to BLn. Gates of the source select transistors SST may be coupled to source select lines SSL1, SSL2_1, and SSL2_2. Gates of the memory cells MC may be coupled to the word lines WL. Gates of the drain select transistors DST may be coupled to drain select lines DSL11 to DSL26.

Some of the source select transistors SST included in the 11th memory block BLK11 may be commonly coupled to the first source select line SSL1, and the other source select transistors SST may be commonly coupled to the 2_1th source select line SSL2_1. The first source select line SSL1 may be commonly coupled to some of the source select transistors SST included in the 21st memory block BLK21. For example, the source select transistors SST included in the first to third strings arranged in the Y direction, among the source select transistors SST included in the 11th and 21st memory blocks BLK11 and BLK21, may be commonly coupled to the first source select line SSL1.

The source select transistors SST included in the fourth to sixth strings, among the source select transistors SST included in the 11th memory block BLK11, may be commonly coupled to the 2_1th source select line SSL2_1. The source select transistors SST included in the fourth to sixth strings, among the source select transistors SST included in the 21st memory block BLK21, may be commonly coupled to the 2_2th source select line SSL2_2. The 2_1th source select line SSL2_1 and the 2_2th source select line SSL2_2 may be separated from each other on the same layer and be electrically coupled to each other through the row decoder 120.

The memory cells MC which are included in the 11th and 21st memory blocks BLK11 and BLK21 and arranged on the same layer may be commonly coupled to one word line WL. The memory cells MC which are arranged on different layers may be coupled to different word line WL. Although FIG. 4 illustrates the word line WL formed on one layer for a brief explanation of the circuit, the word lines WL may actually be coupled to all memory cells MC. Memory cells which are included in the 11th and 21st memory blocks BLK11 and BLK21 and arranged on the same layer may be coupled to the same word line WL. A voltage which is applied to the selected word line, among the word lines WL, may be commonly transferred to the selected word line among the word lines WL.

To differentiate selected strings during a program or read operation, different drain select lines DSL11 to DSL26 may be coupled to the drain select transistors DST. For example, the drain select transistors DST which are arranged in the X direction, among the drain select transistors DST included in the 11th memory block BLK11, may be commonly coupled to the same drain select line (one of DSL11 to DSL16), and the drain select transistors DST which are arranged in the Y direction may be coupled to different drain select lines DSL11 to DSL16. The drain select transistors DST which are arranged in the X direction, among the drain select transistors DST included in the 21st memory block BLK21, may be commonly coupled to the same drain select line (one of DSL21 to DSL26), and the drain select transistors DST which are arranged in the Y direction may be coupled to different drain select lines DSL21 to DSL26.

In the connection region CNR, the first source select line SSL1, the 2_1th source select line SSL2_1, the 2_2th source select line SSL2_2, the word lines WL, and the 11th to 26th drain select lines DSL11 to DSL26 may be coupled to the row decoder 120 through contacts.

The row decoder 120 may include a plurality of pass transistors which are configured to transfer operating voltages generated by the voltage generating circuit 130 to each of the first source select line SSL1, the 2_1th source select line SSL2_1, the 2_2th source select line SSL2_2, the word lines WL, and the 11th to 26th drain select lines DSL11 to DSL26. A first pass transistor P1 and a second pass transistor P2 which are configured to transfer the operating voltages to the first source select line SSL1, the 2_1th source select line SSL2_1, or the 2_2th source select line SSL2_2, among the plurality of pass transistors, may be shown as an example in FIG. 4. Though not shown in FIG. 4, the row decoder 120 may further include a plurality of pass transistors which are configured to transfer the operating voltages to the word lines WL and the 11th to 26th drain select lines DSL11 to DSL26.

The first pass transistor P1 may be turned on or off by a voltage applied to a first pass line SPA1. The second pass transistor P2 may be turned on or off by a voltage applied to a second pass line SPA2. A third pass transistor P3 may be turned on or off by a voltage applied to a third pass line SPA3.

A drain of the first pass transistor P1 may be coupled to the voltage generating circuit 130, and a source thereof may be coupled to the first source select line SSL1. A drain of the second pass transistor P2 may be coupled to the voltage generating circuit 130, and a source thereof may be coupled to the 2_1th source select line SSL2_1. A drain of the third pass transistor P3 may be coupled to the voltage generating circuit 130, and a source thereof may be coupled to the 2_2th source select line SSL2_2.

Therefore, when a turn-on voltage is applied to the first pass line SPA1, the first pass transistor P1 may be turned on. Thus, the operating voltage generated by the voltage generating circuit 130 may be transferred to the first source select line SSL1 which is commonly coupled to the 11th and 21st memory blocks BLK11 and BLK21. When the turn-on voltage is applied to the second pass line SPA2, the second pass transistor P2 may be turned on. Thus, the operating voltage generated by the voltage generating circuit 130 may be transferred to the 2_1th source select line SSL2_1 which is coupled to the 11th memory block BLK11. When the turn-on voltage is applied to the third pass line SPA3, the third pass transistor P3 may be turned on. Thus, the operating voltage generated by the voltage generating circuit 130 may be transferred to the 2_2th source select line SSL2_2 which is coupled to the 21st memory blocks BLK21.

Therefore, when the turn-on voltage or the turn-off voltage is selectively applied to the first to third pass lines SPA1 to SPA3 or operating voltages having different voltage levels are generated by the voltage generating circuit 130, the source select transistors SST coupled to different source select lines may be selectively turned on or off. For example, during a program or read operation, when the select transistors coupled to the first source select line SSL1 are turned on, the select transistors coupled to the 2_1th and 2_2th source select line SSL2_1 and SSL2_2 may be turned off. In an embodiment, when the source select transistors SST coupled to unselected strings are selectively turned off in a selected memory block, unnecessary current consumption may be reduced, and the current does not flow in a channel of the unselected strings. As a result, in an embodiment, interference between memory cells included in each of the selected and unselected strings may be reduced.

The structure of the source select lines in the above circuit will described below.

Figure 5:
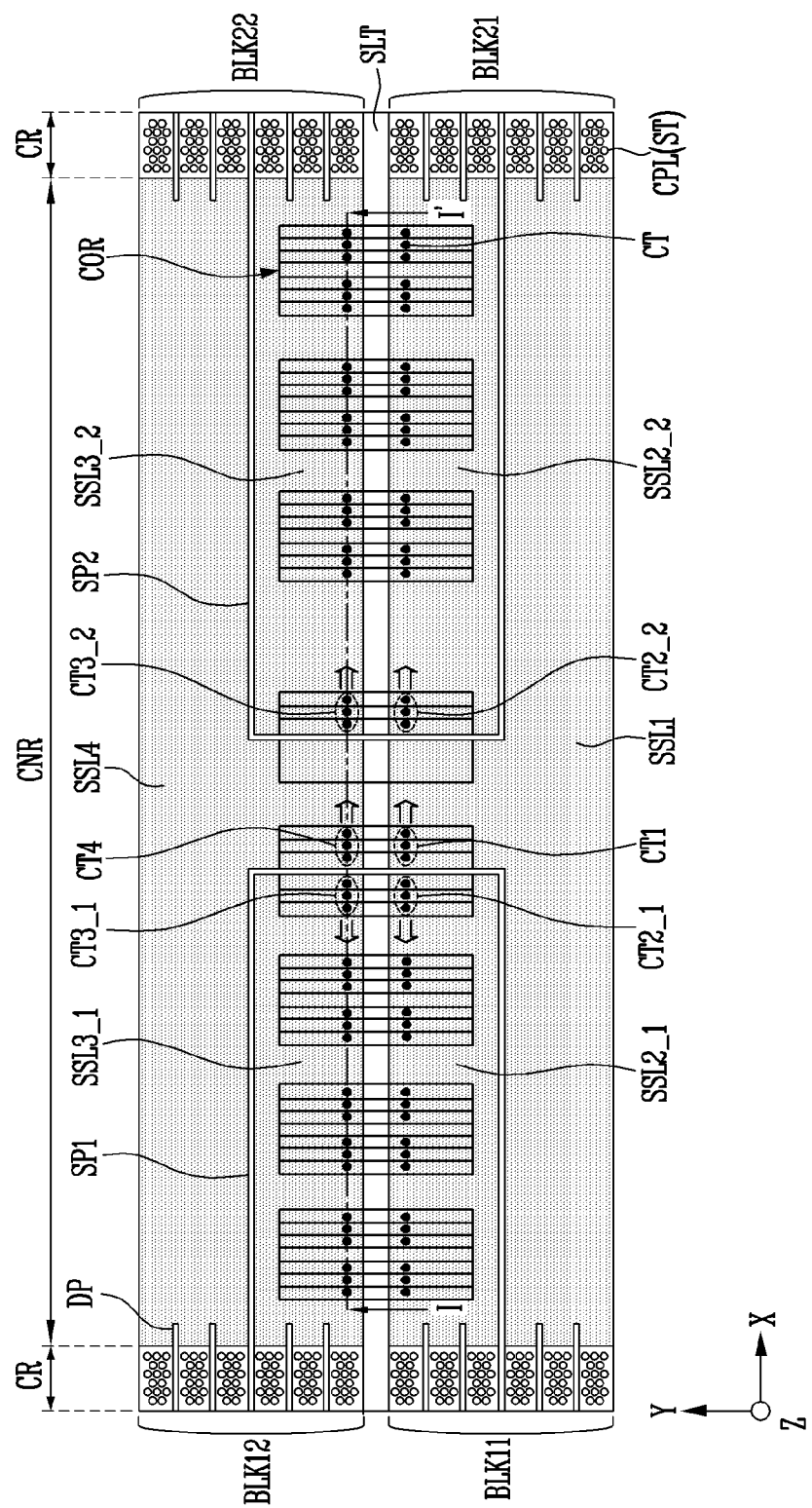
FIG. 5 is a diagram illustrating the layout of a memory device according to an embodiment of the present disclosure.

FIG. 5 is a diagram illustrating the layout of a memory device according to an embodiment of the present disclosure.

Referring to FIG. 5, the 11th and 21st memory blocks BLK11 and BLK21 may be arranged in the X direction. The 12th memory block BLK12 and the 11th memory block BLK11 may be arranged in the Y direction. The 22nd memory block BLK22 and the 21st memory block BLK21 may be arranged in the Y direction. As a result, the 12th and 22nd memory blocks BLK12 and BLK22 may be arranged in the X direction. A slit SLT may be formed between the 11th and 21st memory blocks BLK11 and BLK21 and the 12th and 22nd memory blocks BLK12 and BLK22, whereby the memory blocks may be differentiated from each other. For example, the slit SLT may have a pattern which extends in the X direction. Therefore, the 11th and 12th memory blocks BLK11 and BLK12 which are arranged in the Y direction may be separated from each other. The 21st and 22nd memory blocks BLK21 and BLK22 which are arranged in the Y direction may be separated from each other by the slit SLT.

The memory cells which are included in the 11th, 21st, 12th, and 22nd memory blocks BLK11, BLK21, BLK12, and BLK22 may be formed in a cell region CR. The connection region CNR may be formed between cell regions CR of different memory blocks. The cell plugs CPL corresponding to the strings ST may be formed in the cell region CR. Drain select lines which are formed in the cell region CR may be separated from each other by a drain isolation pattern DP.

The first source select line SSL1 and the 2_1th source select line SSL2_1 which are formed on the same layer may be separated from each other by a first source isolation pattern SP1. A 3_1th source select line SSL3_1 and a fourth select line SSL4 may be separated from each other by the first source isolation pattern SP1. The first source isolation pattern SP1 may extend in the X direction from the cell region CR of the 11th memory block BLK11, may extend in the Y direction in a connection open region COR through which the source select lines are exposed, and may extend to the cell region CR of the 12th memory block BLK12 in the X direction. The first source select line SSL1 and the 2_2th source select line SSL2_2 which are formed on the same layer may be separated from each other by a second source isolation pattern SP2. A 3_2th source select line SSL3_2 and a fourth source select line SSL4 may be separated from each other by the second source isolation pattern SP2. The second source isolation pattern SP2 extend in the X direction from the cell region CR of the 21st memory block BLK21, may extend in the Y direction in the connection open region COR through which the source select lines are exposed, and may extend to the cell region CR of the 22nd memory block BLK22 in the X direction. The 2_1th source select line SSL2_1 and the 3_1th source select line SSL3_1 may be separated from each other by the slit SLT. The first source select line SSL1 and the fourth source select line SSL4 may be separated from each other by the slit SLT. The 2_2th source select line SSL2_2 and the 3_2th source select line SSL3_2 may be separated from each other by the slit SLT.

Contacts CT for electrically coupling gate lines extending from the cell region CR to the peripheral circuit may be formed in the connection region CNR. For example, in the connection region CNR, gate lines may have a stepped structure and the contacts CT may be formed in the connection open region COR through which different layers of the stepped structure are exposed. The gate lines may include source select lines, word lines, and drain select lines.

According to an embodiment, a region through which the source select lines are exposed, among the connection open regions COR, may be separated by the first source isolation pattern SP1 or the second source isolation pattern SP2. Different contacts may contact source select lines which are separated by the first or second source isolation pattern SP1 or SP2. For example, the first source select line SSL1 may be coupled to the peripheral circuit through first contacts CT1 which are formed in the connection open region COR. The 2_1th source select line SSL2_1 may be coupled to the peripheral circuit through 2_1th contacts CT2_1 which are formed in the connection open region COR. The 2_2th source select line SSL2_2 may be coupled to the peripheral circuit through 2_2th contacts CT2_2 which are formed in the connection open region COR. The 3_1th source select line SSL3_1 may be coupled to the peripheral circuit through 3_1th contacts CT3_1 which are formed in the connection open region COR. The 3_2th source select line SSL3_2 may be coupled to the peripheral circuit through 3_2th contacts CT3_2 which are formed in the connection open region COR. The fourth source select line SSL4 may be coupled to the peripheral circuit through fourth contacts CT4 which are formed in the connection open region COR.

Figure 6:
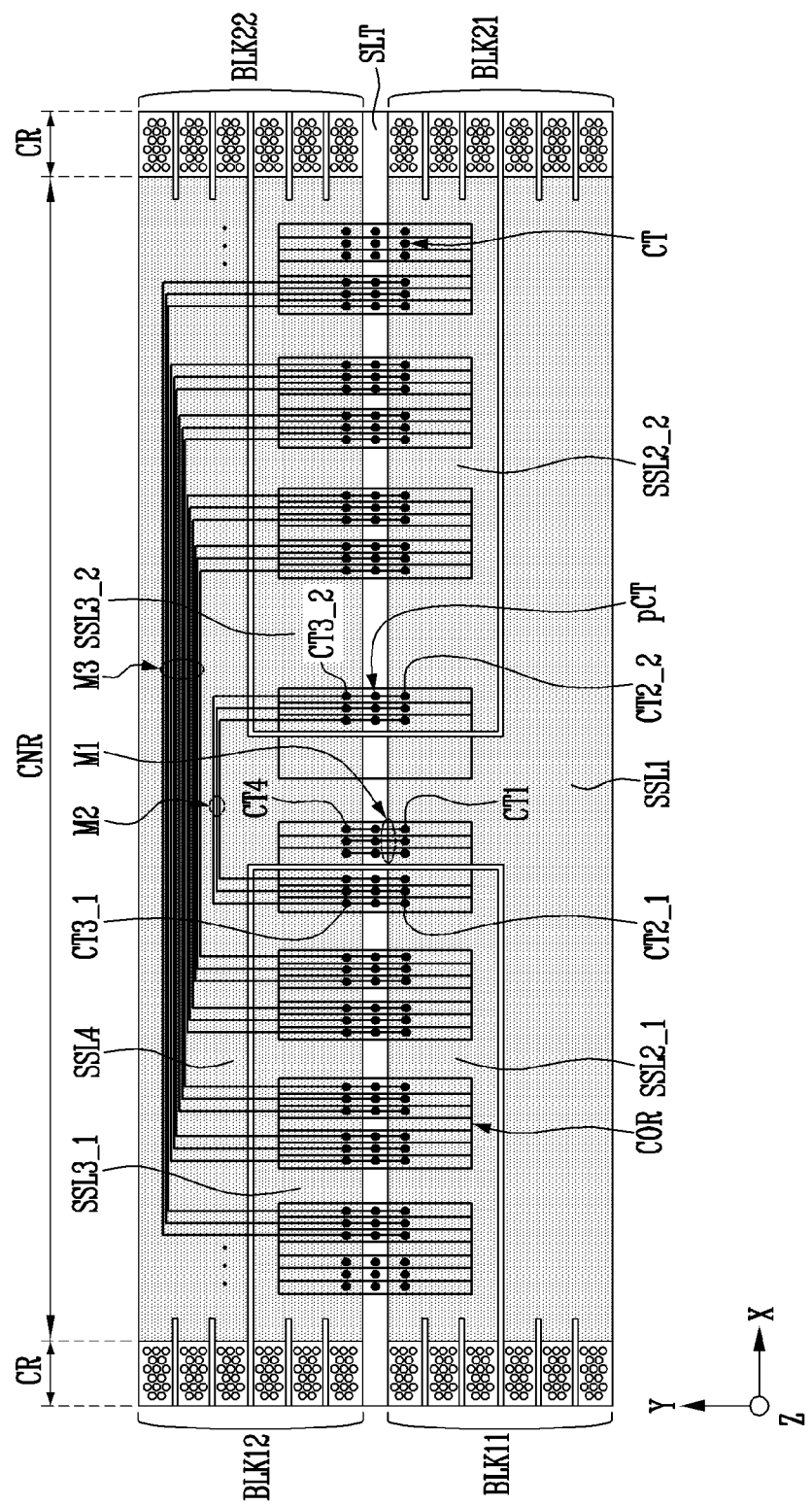
FIG. 6 is a diagram showing connection between contacts shown in FIG. 5.

FIG. 6 is a diagram showing connection between the contacts CT shown in FIG. 5.

Referring to FIG. 6, the contacts CT which are formed in the connection region CNR may contact the peripheral circuit through peripheral contacts pCT which are formed in the connection region CNR, and gate lines which are formed on the same layer and coupled to different memory blocks may be electrically coupled to each other through wires M1 to M3. For example, the first contacts CT1 which contact the first source select line SSL1 and the fourth contacts CT4 which contact the fourth source select line SSL4 may be electrically coupled to each other through first wires M1. The 2_1th contacts CT2_1 which contact the 2_1th source select line SSL2_1, the 2_2th contacts CT2_2 which contact the 2_2th source select line SSL2_2, the 3_1th contacts CT3_1 which contact the 3_1th source select line SSL3_1, and the 3_2th contacts CT3_2 which contact the 3_2th source select line SSL3_2 may be electrically coupled to each other through second wires M2. The contacts CT which contact the word lines of the 11th, 21st, 12th, and 22nd memory blocks BLK11, BLK21, BLK12, and BLK22 may be electrically coupled to each other through third wires M3. Each of the contacts CT which contact the drain select lines of the 11th, 21st, 12th, and 22nd memory blocks BLK11, BLK21, BLK12, and BLK22 may be electrically coupled to the peripheral circuit through the slit SLT.

Figure 7B:
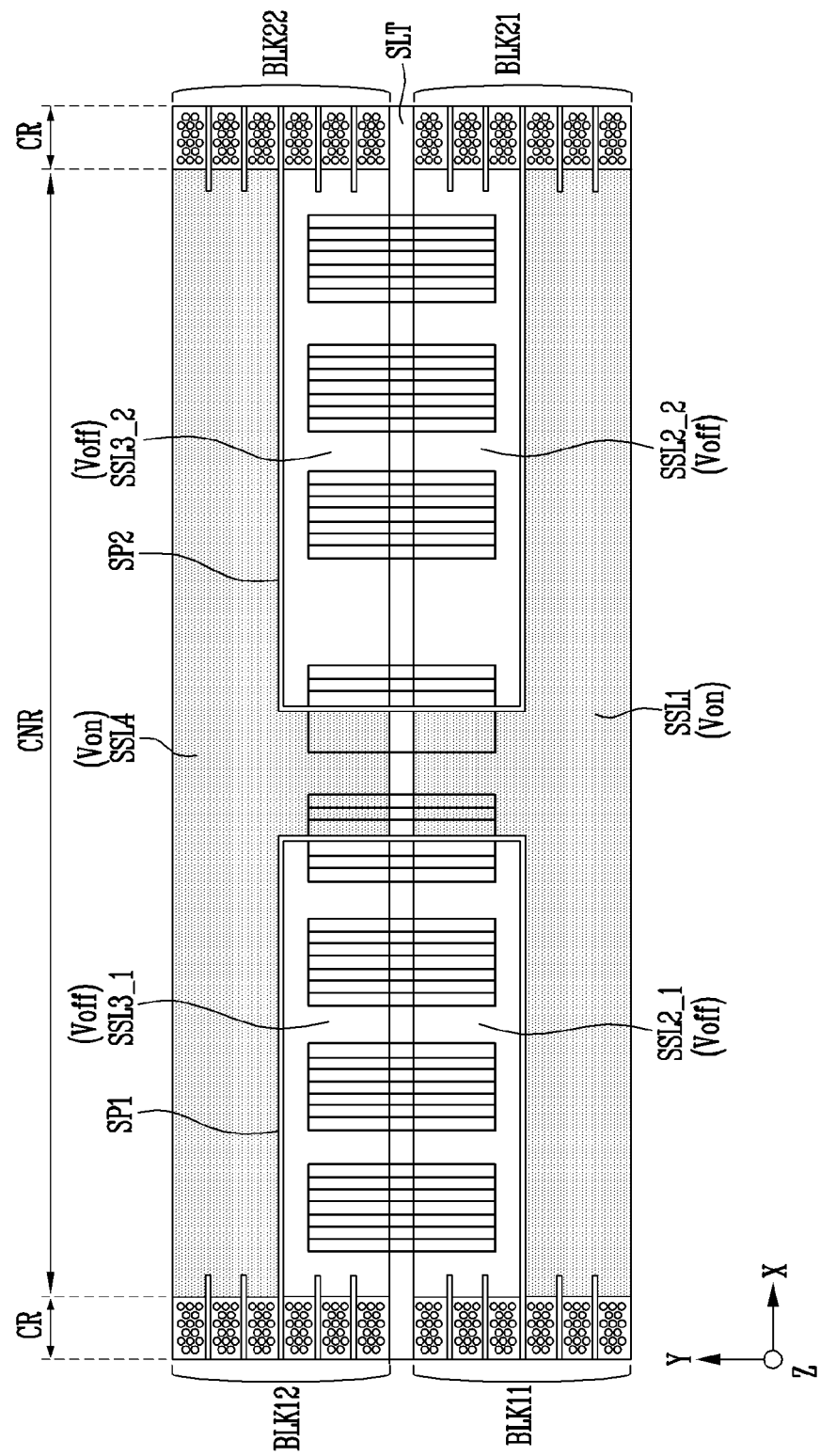

FIGS. 7A and 7B are diagrams illustrating a voltage applied to source select lines according to an embodiment of the present disclosure.

Referring to FIGS. 7A and 7B, the 2_1th and 3_1th source select lines SSL2_1 and SSL3_1 may be separated from the first or fourth source select line SSL1 or SSL4 by the first source isolation pattern SP1, and the 2_2th and 3_2th source select lines SSL2_2 and SSL3_2 may be separated from the first or fourth source select line SSL1 or SSL4 by the second source isolation pattern SP2. Therefore, when a turn-on voltage Von is applied to the 2_1th, 3_1th, 2_2th, and 3_2th source select lines SSL2_1, SSL3_1, SSL2_2, and SSL3_2, a turn-off voltage Voff may be applied to the first and fourth source select lines SSL1 and SSL4. Therefore, when the turn-off voltage Voff is applied to the 2_1th, 3_1th, 2_2th, and 3_2th source select lines SSL2_1, SSL3_1, SSL2_2, and SSL3_2, the turn-on voltage Von may be applied to the first and fourth source select lines SSL1 and SSL4.

Figure 8:
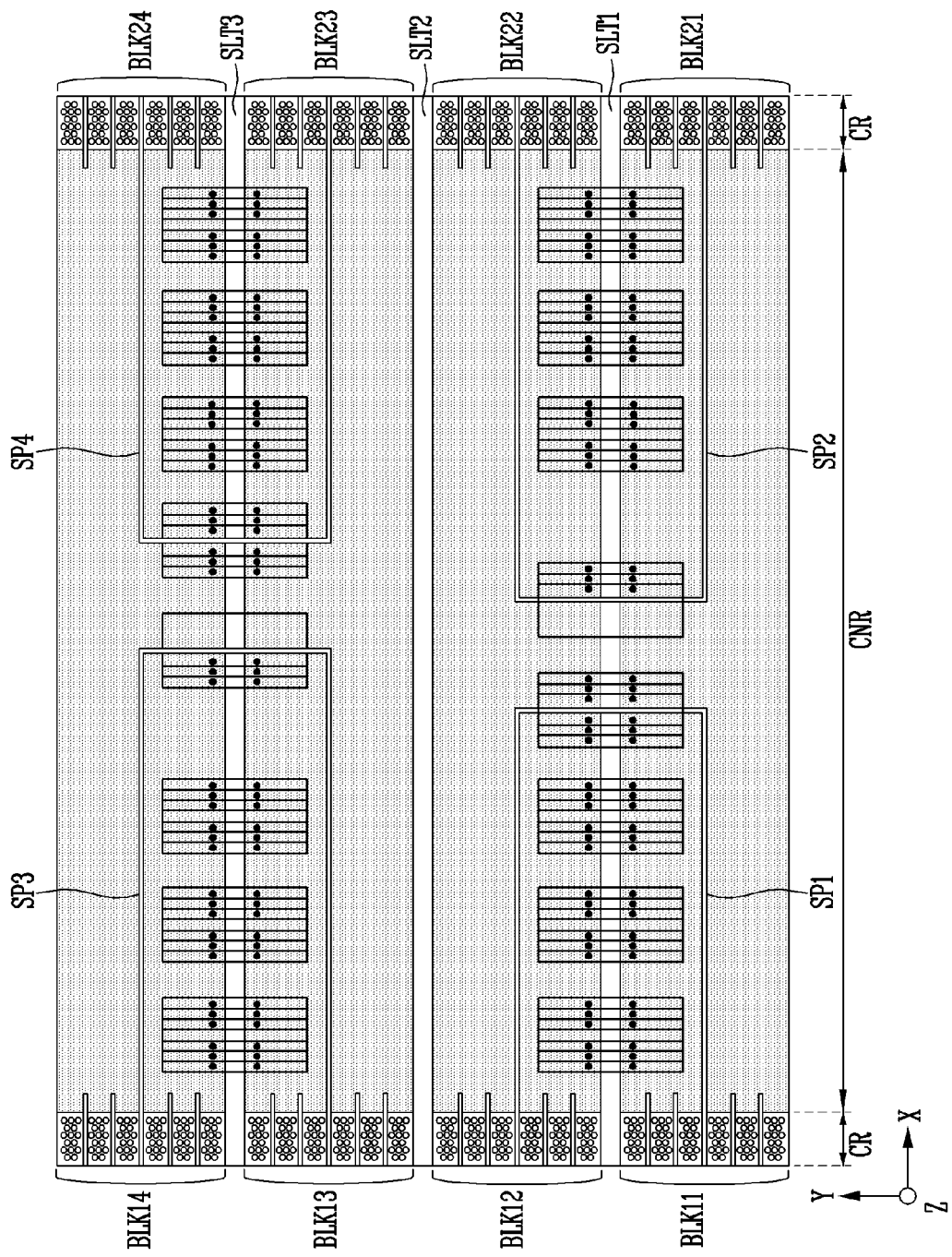
FIG. 8 is a diagram illustrating the layout of a memory device according to another embodiment of the present disclosure.

FIG. 8 is a diagram illustrating the layout of a memory device according to another embodiment of the present disclosure.

Referring to FIG. 8, it may be assumed that the 11th, 12th, 13th, and 14th memory blocks BLK11, BLK12, BLK13, and BLK14 are arranged in the Y direction, and the 21st, 22nd, 23rd, and 24th memory blocks BLK21, BLK22, BLK23, and BLK24 are arranged in the Y direction. The 11th and 21st memory blocks BLK11 and BLK21 may be arranged in the X direction, the 12th and 22nd memory blocks BLK12 and BLK22 may be arranged in the X direction, the 13th and 23rd memory blocks BLK13 and BLK23 may be arranged in the X direction, and the 14th and 24th memory blocks BLK14 and BLK24 may be arranged in the X direction.

Source select lines of the 11th and 12th memory blocks BLK11 and BLK12 arranged in the Y direction may be separated by the first source isolation pattern SP1. Source select lines of the 21st and 22nd memory blocks BLK21 and BLK22 arranged in the Y direction may be separated by the second source isolation pattern SP2. In the connection region CNR, the length of the first source isolation pattern SP1 in the X direction may be smaller than the length of the second source isolation pattern SP2 in the X direction.

Source select lines of the 13th and 14th memory blocks BLK13 and BLK14 arranged in the Y direction may be separated by a third source isolation pattern SP3. Source select lines of the 23rd and 24th memory blocks BLK23 and BLK24 arranged in the Y direction may be separated by a fourth source isolation pattern SP4. In the connection region CNR, the length of the third source isolation pattern SP3 in the X direction may be the same as that of the second source isolation pattern SP2 in the X direction, and the length of the fourth source isolation pattern SP4 in the X direction may be the same as that of the first source isolation pattern SP1 in the X direction.

As described above, the first and second source isolation patterns SP1 and SP2 and the third and fourth source isolation patterns SP3 and SP4 may be arranged asymmetrically, so that interference between adjacent source select lines may be reduced. As a result, the source isolation patterns may have different lengths. However, depending on memory devices, the first and second source isolation patterns SP1 and SP2 and the third and fourth source isolation patterns SP3 and SP4 may be arranged symmetrically. In addition to the pattern shown in the drawing, various other patterns may be formed.

Figure 9:
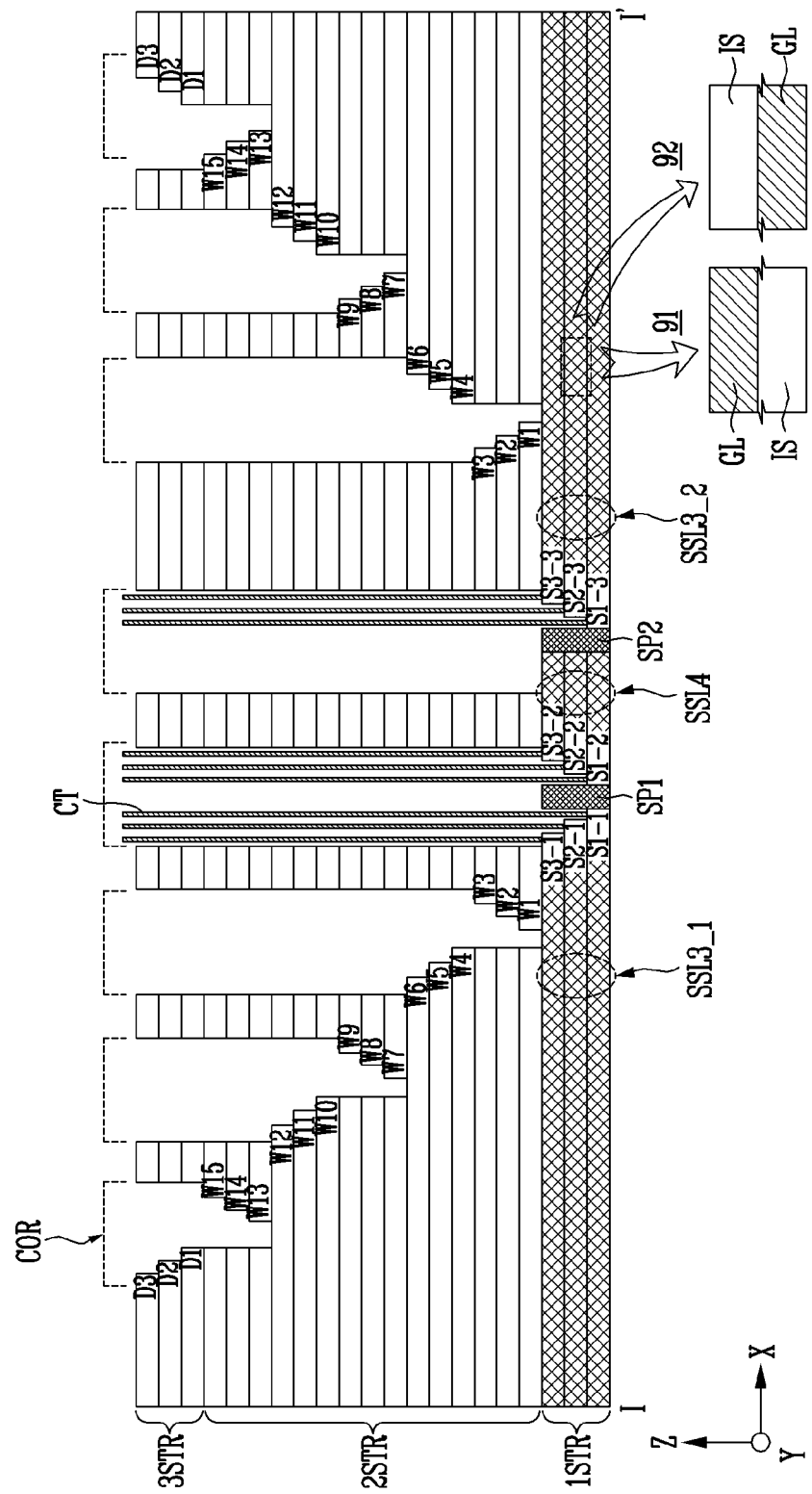
FIG. 9 is a cross-sectional diagram illustrating a memory device according to an embodiment of the present disclosure.

FIG. 9 is a cross-sectional diagram illustrating a memory device according to an embodiment of the present disclosure. In FIG. 9, the connection region CNR shown in FIG. 5 is taken along a direction I-I'.

Referring to FIGS. 5 and 9, the gate lines GL which are formed in the cell region CR may extend in the connection region CNR. The insulating layers IS may be formed between the gate lines GL formed on different layers. The insulating layer IS and the gate line GL may form a pair. Pairs of the insulating layers IS and the gate lines GL may be divided into source groups S1-1, S1-2, S1-3, S2-1, S2-2, S2-3, S3-1, S3-2, and S3-3, word line groups W1 to W15, or drain groups D1 to D3, depending on the purpose of the gate lines GL. The stacking order of the gate line GL and the insulating layer IS forming a pair might not be limited to a predetermined order. For example, the gate line GL may be stacked on top of the insulating layer IS to form a pair (91), and the insulating layer IS may be stacked on top of the gate line GL to form a pair (92). The word "predetermined" as used herein with respect to a parameter, such as a predetermined order, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The source groups S1-1, S1-2, S1-3, S2-1, S2-2, S2-3, S3-1, S3-2, and S3-3 may form a first stacked structure 1STR. The word line groups W1 to W15 may form a second stacked structure 2STR which is stacked over the first stacked structure 1STR. The drain groups D1 to D3 may form a third stacked structure 3STR which is stacked over the second stacked structure 2STR. The first to third stacked structures 1STR to 3STR will be described below in more detail. The respective numbers of the groups are not limited to those shown in FIG. 9.

The gate lines GL included in the 1-1th, 2-1th, and 3-1th source groups S1-1, S2-1, and S3-1, among the source groups S1-1, S1-2, S1-3, S2-1, S2-2, S2-3, S3-1, S3-2, and S3-3, may be the 3_1th source select lines SSL3_1. The gate lines GL included in the 1-2th, 2-2th, and 3-2th source groups S1-2, S2-2, and S3-2 may be the fourth source select lines SSL4. The gate lines GL included in the 1-3th, 2-3th, and 3-3th source groups S1-3, S2-3, and S3-3 may be a 3_3th source select lines SSL3_3. The gate lines GL included in the 1-1th, 2-1th, and 3-1th source groups S1-1, S2-1, and S3-1 may be separated from the 1-2th, 2-2th, and 3-2th source groups S1-2, S2-2, and S3-2 by the first source isolation pattern SP1. The 1-3th, 2-3th, and 3-3th source groups S1-3, S2-3, and S3-3 may be separated from the 1-2th, 2-2th, and 3-2th source groups S1-2, S2-2, and S3-2 by the second source isolation pattern SP2. In other words, the 1-1th, 1-2th, and 1-3th source groups S1-1, S1-2, and S1-3 may be formed on the same layer and separated from each other by the first or second source isolation patterns SP1 or SP2.

The 2-1th, 2-2th, and 2-3th source groups S2-1, S2-2, and S2-3 may be formed on the same layer and separated from each other by the first or second source isolation patterns SP1 or SP2. The 3-1th, 3-2th, and 3-3th source groups S3-1, S3-2, and S3-3 may be formed on the same layer and separated from each other by the first or second source isolation patterns SP1 or SP2. The 1-1th, 1-2th, and 1-3th source groups S1-1, S1-2, and S1-3 and the 1-2th, 2-2th, and 3-2th source groups S1-2, S2-2, and S2-2 which are adjacent to the first source isolation pattern SP1 may have a stepped structure in the connection open region COR, and the contacts CT may be formed on respective steps of the stepped structure. The 1-3th, 2-3th, and 3-3th source groups S1-3, S2-3, and S3-3 adjacent to the second source isolation pattern SP2 may have a stepped structure in the connection open region COR, and the contacts CT may be formed on the respective steps of the source groups.

The first to 15th word line groups W1 to W15 may be sequentially stacked over the 3-1th, 3-2th, and 3-3th source groups S3-1, S3-2, and S3-3. The first to third drain groups D1 to D3 may be sequentially stacked over the 15th word line group W15. The first to 15th word line groups W1 to W15 and the first to third drain groups D1 to D3 may also have a stepped structure in the connection open region COR. Though not shown in FIG. 9, the contacts CT may be formed on the respective steps of the stepped structure. As a result, the first to third stacked structures 1STR to 3STR may include insulating layers and gate lines.

FIGS. 10A to 10G are diagrams illustrating a method of manufacturing a memory device according to an embodiment of the present disclosure.

Figure 10A:
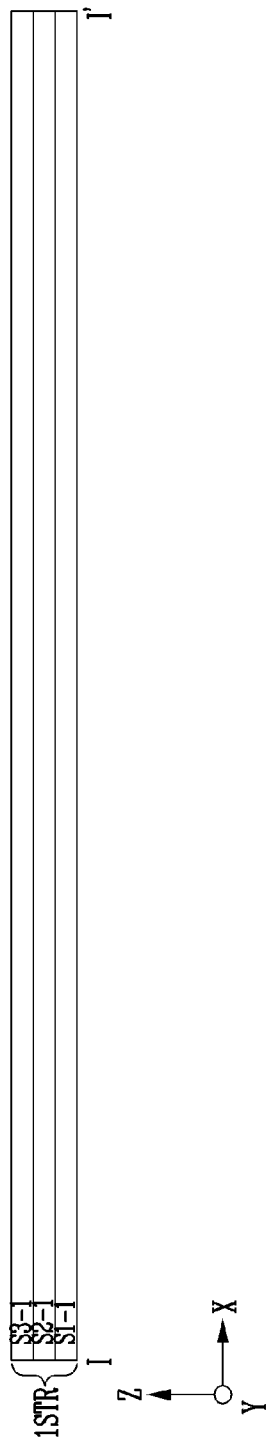
FIGS. 10A, 10B, 10C, 10D, 10E, 10F, and 10G are diagrams illustrating a method of manufacturing a memory device according to an embodiment of the present disclosure.

Referring to FIG. 10A, the first stacked structure 1STR may be formed over a lower structure. The first stacked structure 1STR may include the 1-1th, 2-1th, and 3-1th source groups S1-1, S2-1, and S3-1 which are stacked sequentially on top of each other. Each of the 1-1th, 2-1th, and 3-1th source groups S1-1, S2-1, and S3-1 may include insulating layers and sacrificial layers. For example, insulating layers and sacrificial layers may be alternately stacked on top of each other to form source groups.

Figure 10B:
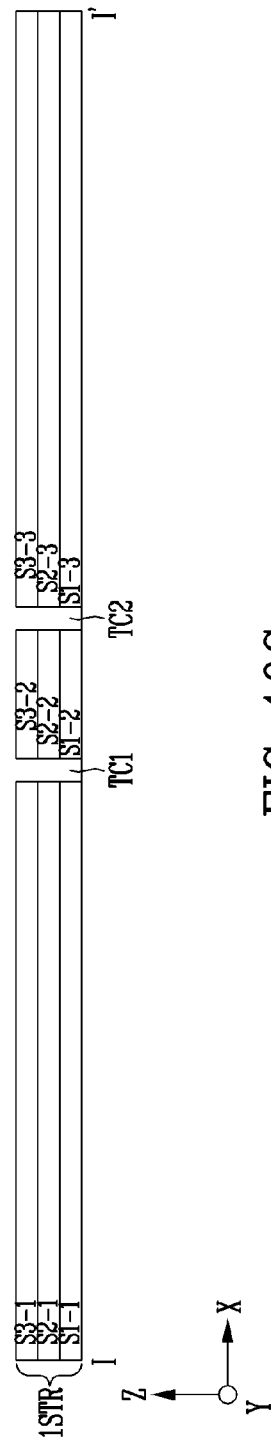

Referring to FIG. 10B, to separate source groups formed on the same layer, first and second trenches TC1 and TC2 may be formed. For example, the first stacked structure 1STR may be separated into the 1-1th, 2-1th, and 3-1th source groups S1-1, S2-1, and S3-1 and the 1-2th, 2-2th, and 3-2th source groups S1-2, S2-2, and S3-2 by the first trench TC1, and may be separated into the 1-2th, 2-2th, and 3-2th source groups S1-2, S2-2, and S3-2 and the 1-3th, 2-3th, and 3-3th source groups S1-3, S2-3, and S3-3 by the second trench TC2.

Figure 10C:
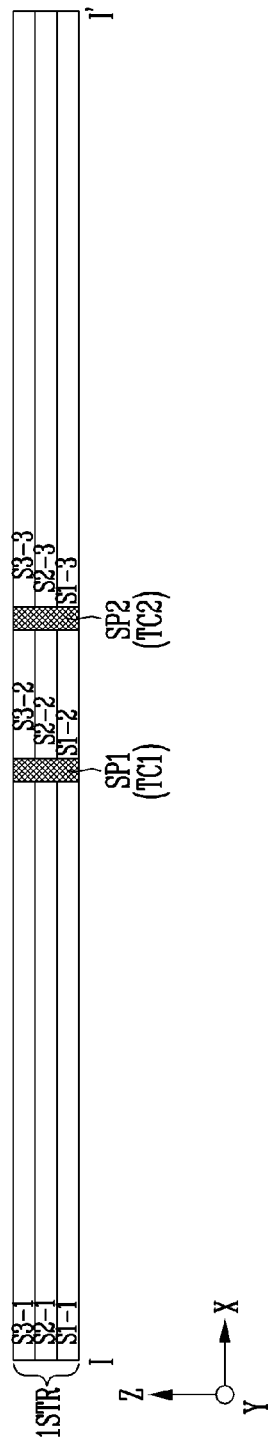

Referring to FIG. 10C, by filling the first and second trenches TC1 and TC2 with an insulating material, the first and second source isolation patterns SP1 and SP2 may be formed.

Figure 10D:
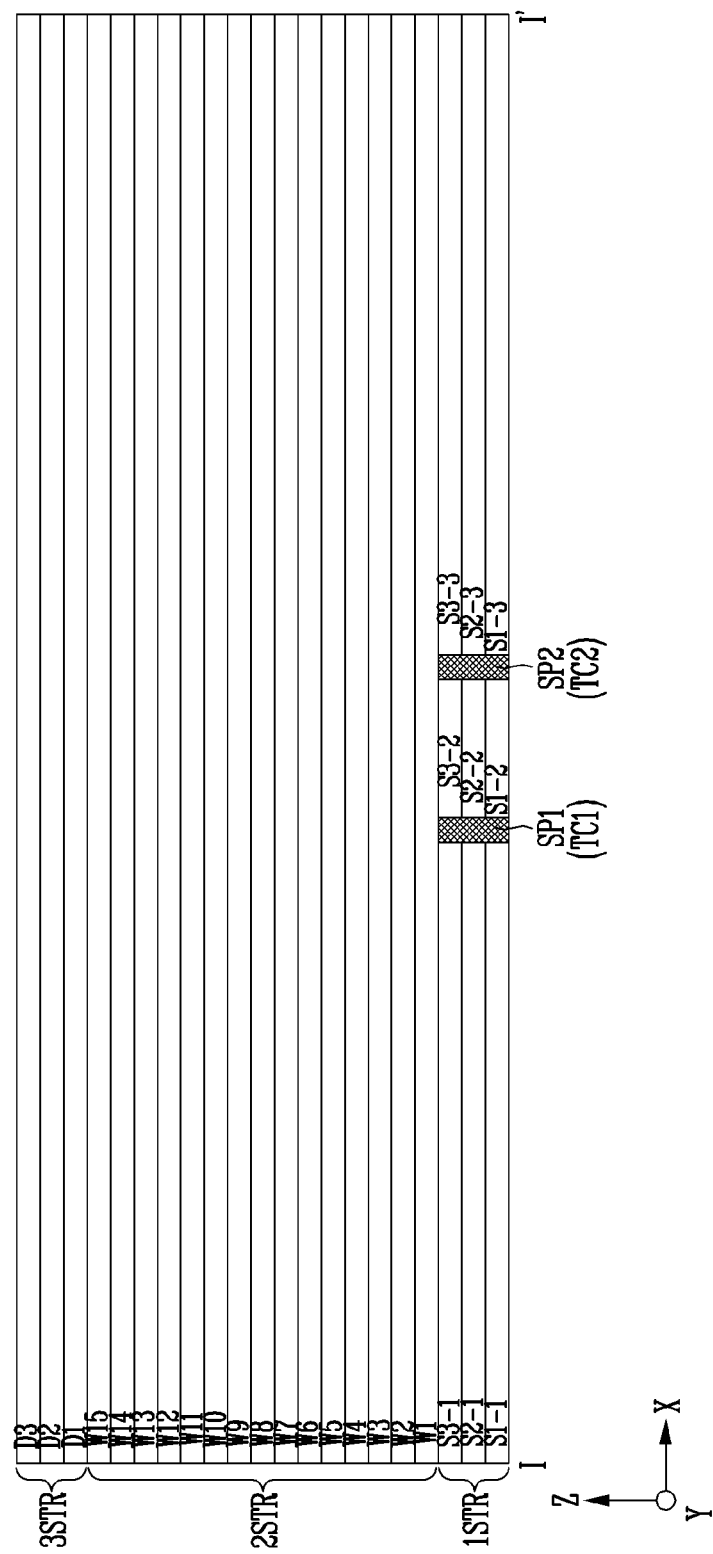

Referring to FIG. 10D, the second and third stacked structures 2STR and 3STR may be stacked on top of the first stacked structure 1STR. The second stacked structure 2STR may be provided for forming word lines, and the third stacked structure 3STR may be provided for forming drain select lines. The second and third stacked structures 2STR and 3STR may also include the same materials as the first stacked structure 1STR.

More specifically, when the first to third stacked structures 1STR to 3STR are formed, cell plugs may be formed in the cell region, and trenches for a slit may be formed between the memory blocks to separate the memory blocks from each other. The sacrificial layers which are exposed between the trenches for the slit may be removed, and gate lines may be formed by filling regions, from which the sacrificial layers are removed, with a conductive material. As a result, the first stacked structure 1STR may include the 1-1th, 2-1th, 3-1th, 1-2th, 2-2th, 3-2th, 1-3th, 2-3th, and 3-3th source groups S1-1, S2-1, S3-1, S1-2, S2-2, S3-2, S1-3, S2-3, and S3-3 that include the insulating layers and the word lines. In addition, the second stacked structure 2STR may include the first to 15th word line groups W1 to W15 which include the insulating layers and the word lines, and the third stacked structure 3STR may include the first to third drain groups D1 to D3 which include the insulating layers and the drain select lines.

Figure 10E:
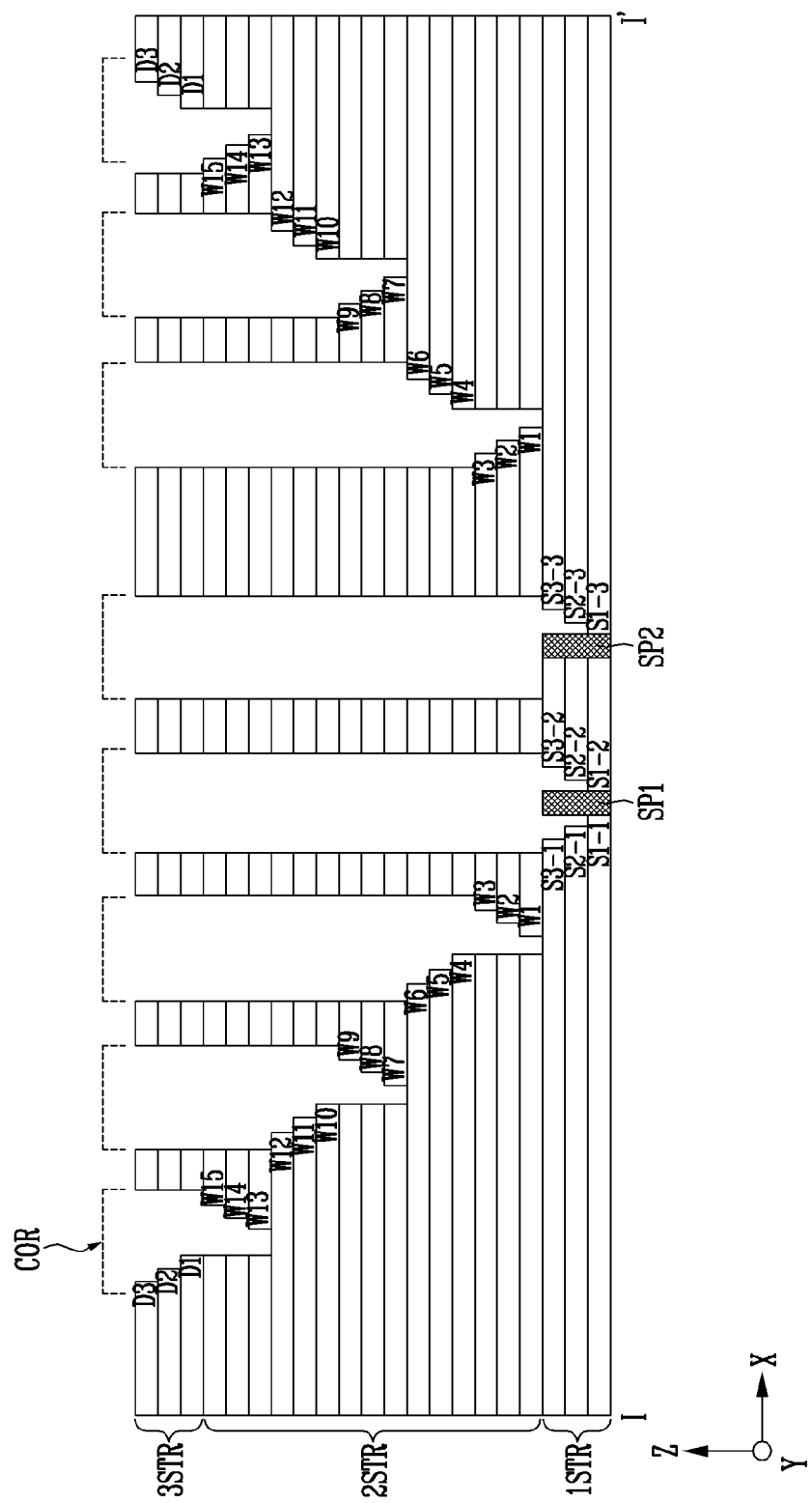

Referring to FIG. 10E, an etch process may be performed such that different layers of the first to third stacked structures 1STR to 3STR may be exposed to form stepped structures through the connection open regions COR. For example, after stepped structures in a vertical direction are formed in part of the third stacked structure 3STR, an etch process may be performed according to depths of the stacked structures to form the stepped structures exposed through the connection open regions COR from the third stacked structure 3STR to the first stacked structure 1STR.

Figure 10F:
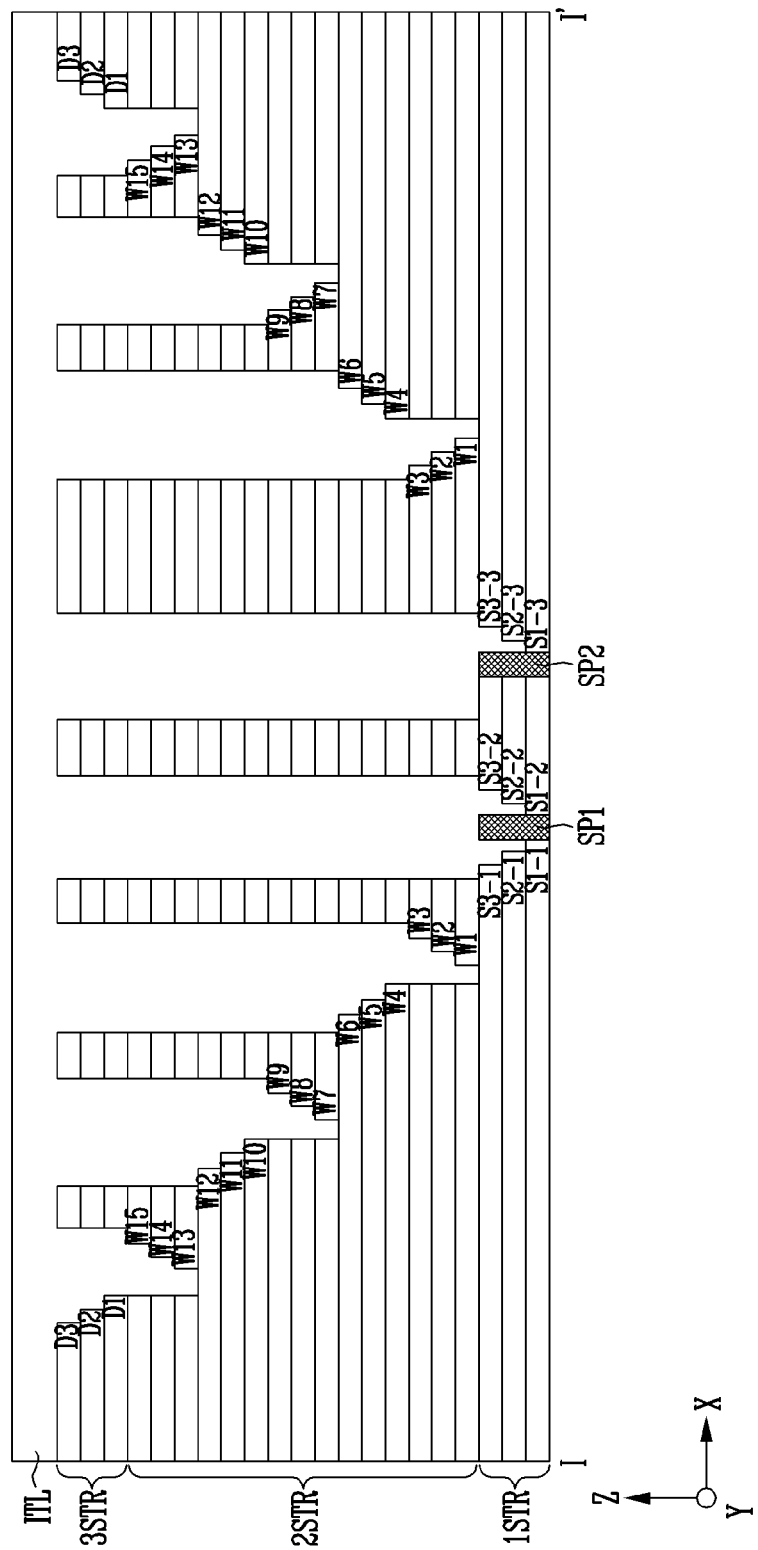

Referring to FIG. 10F, an interlayer insulating layer ITL may be formed over the entire structure to completely cover the stepped structures exposed through the connection open regions COR.

Figure 10G:
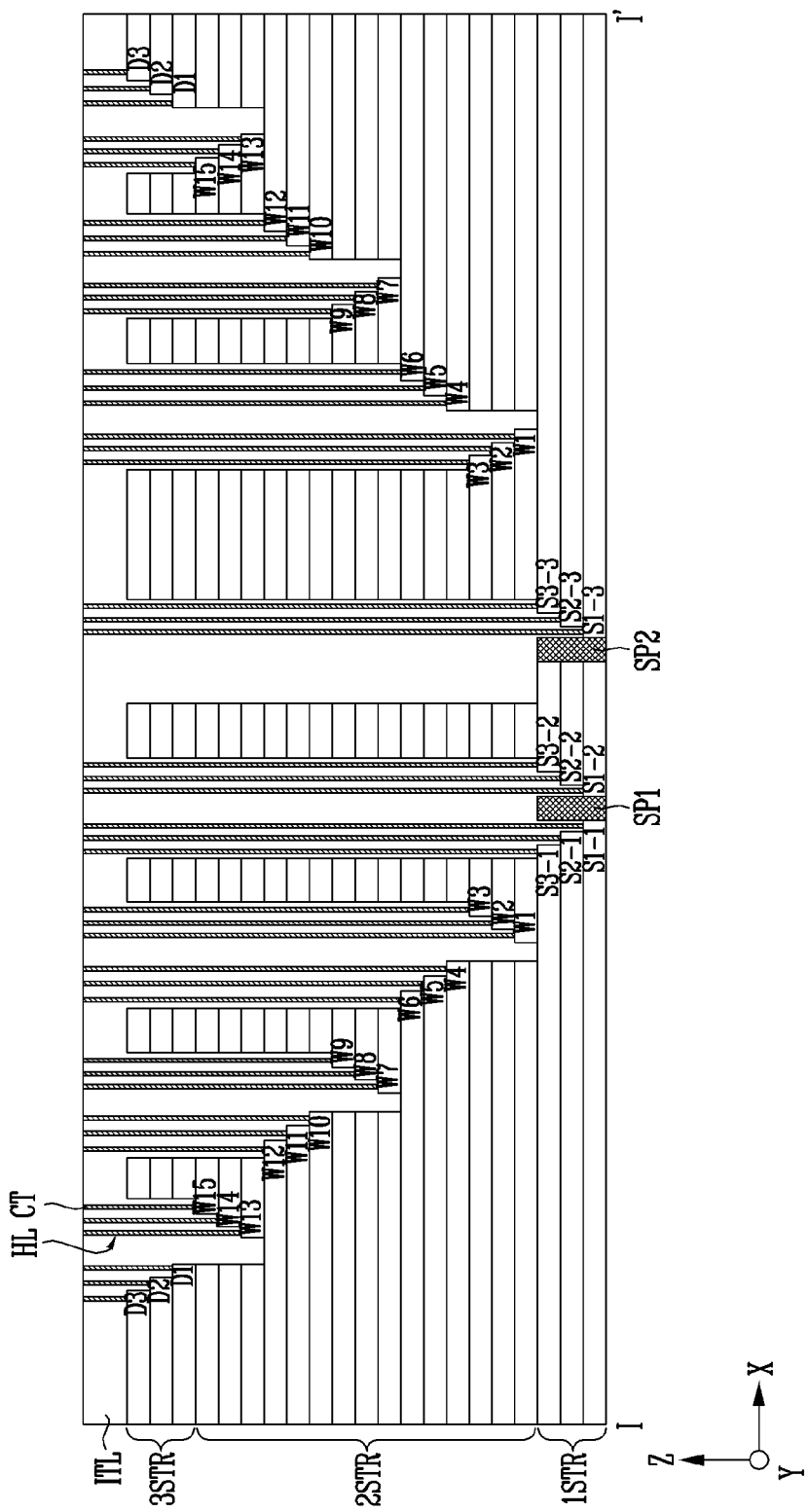

Referring to FIG. 10G, vertical holes HL which vertically pass through the interlayer insulating layer ITL may be formed, and the contacts CT may be formed by filling the vertical holes HL with a conductive material. For example, the vertical holes HL may be formed to expose different stepped structures formed in the first to third stacked structures 1STR to 3STR. The conductive material forming the contacts CT may include doped silicon, tungsten, nickel, or the like. The contacts CT which are formed on the same layer, among the contacts CT which contact the first to 15th word line groups W1 to W15, may contact each other through wires (not shown).

Figure 11A:
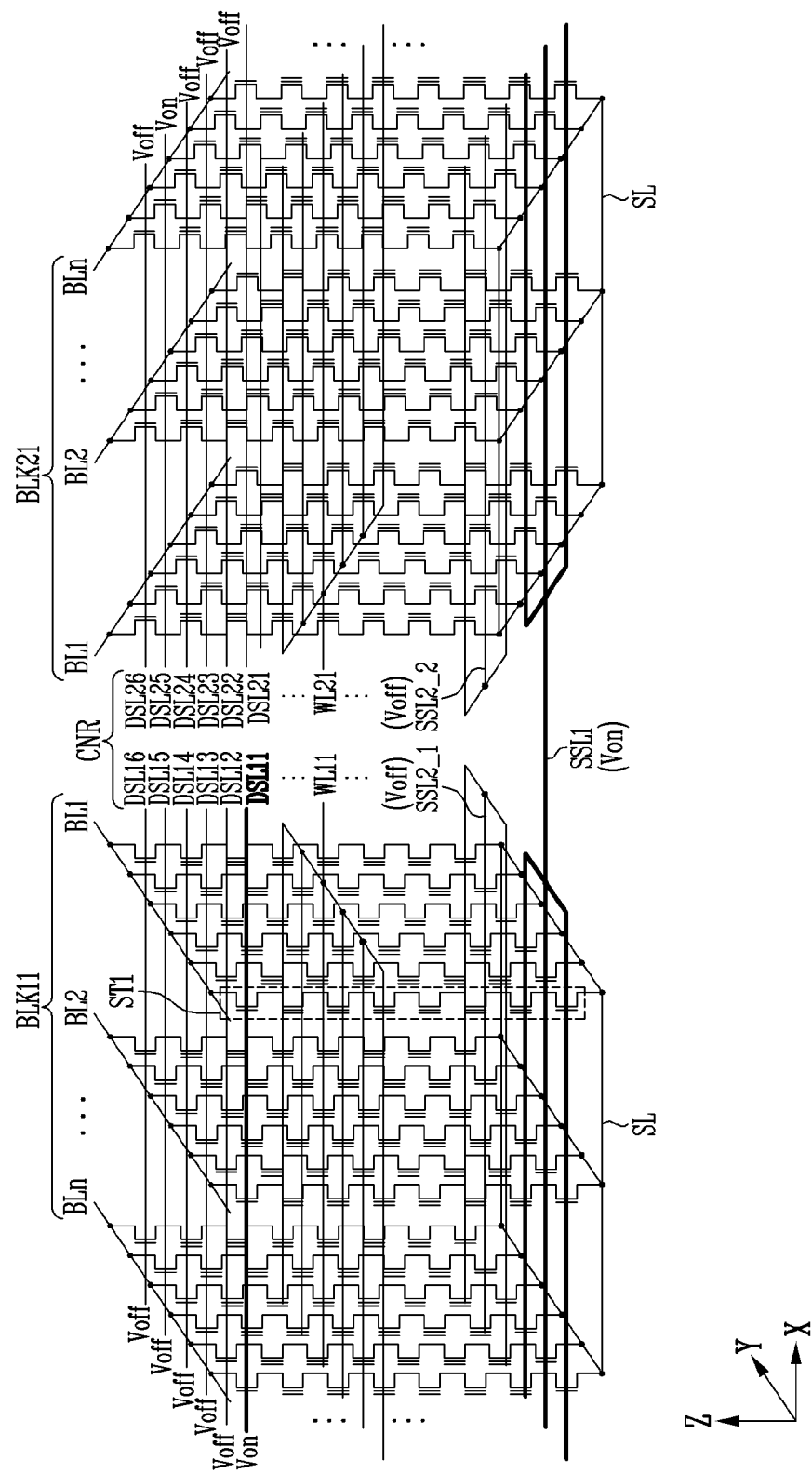

FIGS. 11A and 11B are diagrams illustrating a method of operating a memory device according to an embodiment of the present disclosure.

Referring to FIG. 11A, it may be assumed that during a program or read operation, first strings ST1 included in the 11th memory block BLK11, among a plurality of strings, are selected strings. The turn-on voltage Von may be applied to the 11th drain select line DSL11 coupled to the first strings ST1, and the turn-off voltage Voff may be applied to the 12th to 26th drain select lines DSL12 to DSL26 so that the first strings ST1 may be selected.

Since the first strings ST1 are coupled to the first source select line SSL1, the turn-on voltage Von may be applied to the first source select line SSL1, and the turn-off voltage Voff may be applied to the 2_1th and 2_2th source select lines SSL2_1 and SSL2_2.

Referring to FIG. 11B, it may be assumed that during a program or read operation, fifth strings ST5 included in the 21st memory block BLK21, among the plurality of strings, are selected strings. The fifth strings ST5 may be selected by applying the turn-on voltage Von to the 25th drain select line DSL25 coupled to the fifth strings ST5 and applying the turn-off voltage Voff to the 11th to 24th and 26th drain select lines DSL11 to DSL24 and DSL26.

Since the fifth strings ST5 are coupled to a second source select line SSL2, the turn-on voltage Von may be applied to the 2_1th and 2_2th source select lines SSL2_1 and SSL2_2, and the turn-off voltage Voff may be applied to the first source select line SSL1.

Figure 12:
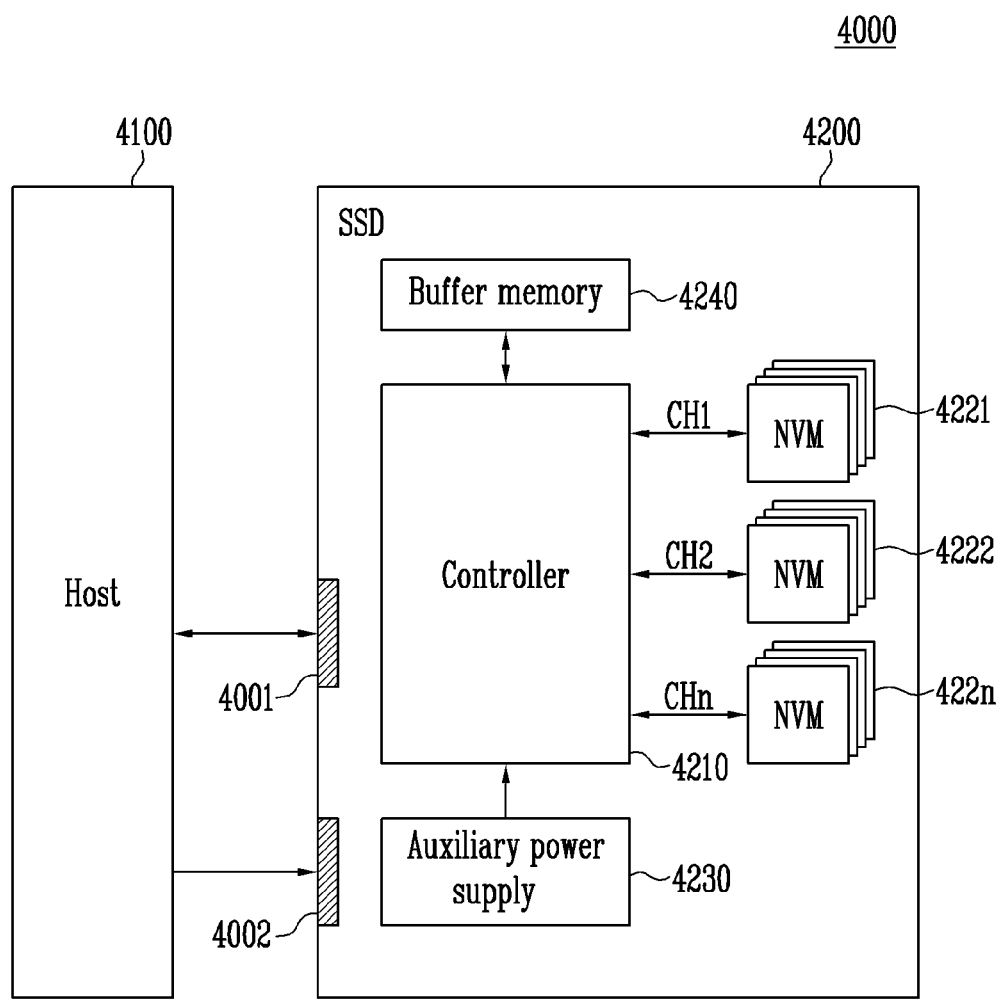
FIG. 12 is a diagram illustrating a solid state drive (SSD) system to which a memory device according to an embodiment of the present disclosure is applied.

FIG. 12 is a block diagram illustrating a solid state drive (SSD) system 4000 to which a memory device according to an embodiment of the present disclosure is applied.

Referring to FIG. 12, the SSD system 4000 may include a host 4100 and an SSD 4200. The SSD 4200 may exchange signals with the host 4100 through a signal connector 4001 and may receive power through a power connector 4002. The SSD 4200 may include a controller 4210, a plurality of flash memories 4221 to 422n, an auxiliary power supply 4230, and a buffer memory 4240.

According to an embodiment, each of the plurality of flash memories 4221 to 422n may be configured in the same manner as the memory device 100 as described above with reference to FIG. 1 is configured. In an embodiment, the plurality of flash memories 4221 to 422n may include nonvolatile memory (NVM).

The controller 4210 may control the plurality of flash memories 4221 to 422n in response to the signals received from the host 4100. In an embodiment, the signals may be based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 4230 may be coupled to the host 4100 through the power connector 4002. The auxiliary power supply 4230 may be supplied and charged with the power from the host 4100. The auxiliary power supply 4230 may supply the power of the SSD 4200 when the power is not constantly supplied from the host 4100. In an embodiment, the auxiliary power supply 4230 may be positioned inside or outside the SSD 4200. For example, the auxiliary power supply 4230 may be disposed in a main board and supply auxiliary power to the SSD 4200.

The buffer memory 4240 may serve as a buffer memory of the SSD 4200. For example, the buffer memory 4240 may store data received from the host 4100 or data received from the plurality of flash memories 4221 to 422n, or may temporarily store metadata (e.g., mapping tables) of the flash memories 4221 to 422n. The buffer memory 4240 may include volatile memories such as DRAM, SDRAM, DDR SDRAM, LPDDR SDRAM, and GRAM, or nonvolatile memories such as FRAM, ReRAM, STT-MRAM, and PRAM.

Figure 13:
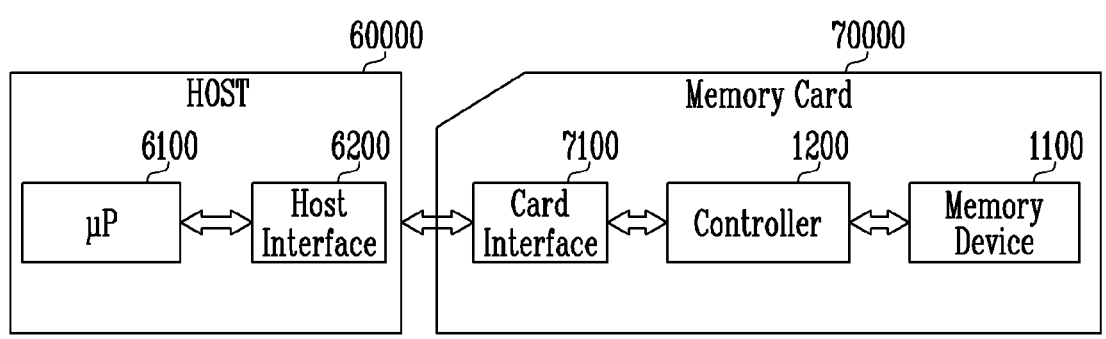
FIG. 13 is a diagram illustrating a memory card system to which a memory device according to an embodiment of the present disclosure is applied.

FIG. 13 is a diagram illustrating a memory card system to which a memory device according to an embodiment of the present disclosure is applied.

Referring to FIG. 13, the memory card system may include a memory card 70000 or a smart card. The memory card 70000 may include a memory device 1100, a controller 1200, and a card interface 7100.

The memory device 1100 may be configured in the same manner as the memory device 100 as shown above in FIG. 1.

The controller 1200 may control data exchange between the memory device 1100 and the card interface 7100. According to an embodiment, the card interface 7100 may be, but is not limited thereto, a secure digital (SD) card interface or a multi-media card (MMC) interface.

The card interface 7100 may interface data exchange between a host 60000 and the controller 1200 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory card 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 in response to control of a microprocessor (μP) 6100.

According to the present disclosure, in an embodiment, an integration density of a memory device may be increased, and interference between memory cells included in the memory device may be reduced.

It will be apparent to those skilled in the art that various modifications can be made to the above-described embodiments of the present disclosure without departing from the spirit or scope of the disclosure. Thus, it is intended that the present disclosure cover all such modifications provided they come within the scope of the appended claims and their equivalents.

What is claimed is:

1. A memory device, comprising:
    a first memory block including a first group of cell plugs and a second group of cell plugs;
    a second memory block including a third group of cell plugs and a fourth group of cell plugs;
    a connection region located between the first and second memory blocks;
    a first source select line commonly coupled to the first group of cell plugs and third group of cell plugs;
    a second source select line coupled to the second group of cell plugs; and
    a third source select line coupled to the fourth group of cell plugs.

2. The memory device of claim 1, wherein when the first memory block, the connection region, and the second memory block are arranged in a first direction,
    the first group of cell plugs and the second group of cell plugs are arranged in a second direction substantially orthogonal to the first direction in the first memory block, and
    the third group of cell plugs and fourth group of cell plugs are arranged in the second direction in the second memory block.

3. The memory device of claim 2, wherein the first source select line is separated from the third source select line by a first source isolation pattern.

4. The memory device of claim 2, wherein the second source select line is separated from the first source select line by a second source isolation pattern.

5. The memory device of claim 1, wherein the second and third source select lines are separated from each other in the connection region.

6. The memory device of claim 5, wherein in the connection region, a protrusion from the first source select line is formed between the second and third source select lines.

7. The memory device of claim 1, further comprising a peripheral circuit arranged under the first memory block, the connection region, and the second memory block.

8. The memory device of claim 7, wherein the peripheral circuit comprises:
    a voltage generating circuit configured to generate an operating voltage for at least one of a program, read, and erase operation; and
    a row decoder configured to transfer the operating voltage to one of the first and third groups of cell plugs and the second and fourth groups of cell plugs.

9. The memory device of claim 8, wherein the row decoder comprises:
    a first pass transistor transferring the operating voltage to the first source select line through a first contact in the connection region;
    a second pass transistor transferring the operating voltage to the second source select line through a second contact in the connection region; and
    a third pass transistor transferring the operating voltage to the third source select line through a third contact in the connection region.

10. The memory device of claim 9, wherein the row decoder transfers the operating voltage to the first and third groups of cell plugs through the first source select line by turning on the first pass transistor.

11. The memory device of claim 9, wherein the row decoder transfers the operating voltage to the second group of cell plugs through the second source select line by turning on the second pass transistor.

12. The memory device of claim 9, wherein the row decoder transfers the operating voltage to the fourth group of cell plugs through the third source select line by turning on the third pass transistor.

13. A memory device, comprising:
    a peripheral circuit; and
    a memory cell array including a source line, source select lines, word lines, and drain select lines stacked on the peripheral circuit,
    wherein the memory cell array comprises:
    first and second memory blocks arranged in a first direction; and
    a connection region located between the first and second memory blocks,
    wherein the source select lines comprise:
    a first source select line commonly coupled to a first group of cell plugs included in the first memory block and a second group of cell plugs included in the second memory block;
    a second source select line coupled to a third group of cell plugs included in the first memory block and extending to the connection region; and
    a third source select line coupled to a fourth group of cell plugs included in the second memory block and extending to the connection region.

14. The memory device of claim 13,
    wherein the first and second source select lines are coupled to gates of source select transistors included in the first memory block, and
    wherein the first and third source select lines are coupled to gates of source select transistors included in the second memory block.

15. The memory device of claim 13, wherein the word lines are coupled to gates of memory cells included in one of the first and second memory block.

16. The memory device of claim 13, wherein the drain select lines are coupled to gates of drain select transistors included in one of the first and second memory block.

17. The memory device of claim 13, wherein the second source select line and the third source select line are separated from each other in the connection region.

18. The memory device of claim 17, wherein the second source select line is separated from the first source select line by a first source isolation pattern.

19. The memory device of claim 18, wherein the third source select line is separated from the first source select line by a second source isolation pattern.

20. The memory device of claim 18, wherein in the connection region, the first source isolation pattern, a protrusion from the first source select line, and the second source isolation pattern are formed between the second source select line and the third source select line.

\* \* \* \* \*